US008238567B2

(12) United States Patent
Burge et al.

(10) Patent No.: US 8,238,567 B2

(45) Date of Patent: Aug. 7, 2012

(54) PERSONAL ACOUSTIC DEVICE POSITION DETERMINATION

(75) Inventors: Benjamin Douglass Burge, Shaker Heights, OH (US); Daniel M. Gauger, Jr., Cambridge, MA (US); Hal Greenberger, Natick, MA (US)

(73) Assignee: Bose Corporation, Framingham, MA (US)

( * ) Notice: Subject to any disclaimer, the term of this patent is extended or adjusted under 35 U.S.C. 154(b) by 445 days.

(21) Appl. No.: 12/413,740

(22) Filed: Mar. 30, 2009

(65) Prior Publication Data

US 2010/0246845 A1 Sep. 30, 2010

(51) Int. Cl.
*H04R 1/10* (2006.01)
*H03K 17/94* (2006.01)

(52) U.S. Cl. ........................................ 381/71.6

(58) Field of Classification Search .................. 381/71.6
See application file for complete search history.

(56) References Cited

U.S. PATENT DOCUMENTS 4,955,729 A * 9/1990 Marx .................... 381/322
5,144,678 A * 9/1992 Lenz .................... 381/384
5,577,511 A * 11/1996 Killion .................... 600/559
5,708,725 A * 1/1998 Ito .................... 381/370
6,118,878 A * 9/2000 Jones .................... 381/72
6,163,610 A * 12/2000 Bartlett et al. .................... 379/433.01
6,532,294 B1 * 3/2003 Rudell .................... 381/315
6,542,436 B1 * 4/2003 Myllyla .................... 367/95
6,567,524 B1 * 5/2003 Svean et al. .................... 381/71.1
6,639,987 B2 * 10/2003 McIntosh .................... 381/71.6
6,687,377 B2 * 2/2004 Voix et al. .................... 381/60
6,704,428 B1 * 3/2004 Wurtz .................... 381/370
6,763,116 B2 * 7/2004 Barthel et al. .................... 381/312
7,039,195 B1 * 5/2006 Svean et al. .................... 381/71.6
7,406,179 B2 * 7/2008 Ryan .................... 381/312
7,418,103 B2 * 8/2008 Sargaison .................... 381/74
7,433,481 B2 * 10/2008 Armstrong et al. .................... 381/312
7,450,730 B2 * 11/2008 Berg et al. .................... 381/312
7,522,739 B2 * 4/2009 Rass et al. .................... 381/323
7,639,827 B2 * 12/2009 Bachler .................... 381/315
7,783,057 B2 8/2010 Park
7,925,029 B2 4/2011 Hollemans et al.
2002/0076057 A1 * 6/2002 Voix .................... 381/60
2003/0161479 A1 8/2003 Yang et al.
2006/0013079 A1 1/2006 Rekimoto
2006/0029234 A1 * 2/2006 Sargaison .................... 381/74
2006/0045304 A1 * 3/2006 Lee et al. .................... 381/384
2006/0215847 A1 9/2006 Hollemans et al.

(Continued)

FOREIGN PATENT DOCUMENTS

DE 102007013719 A1 9/2008

(Continued)

OTHER PUBLICATIONS

International Search Report and Written Opinion dated Aug. 10, 2010 for PCT/US2010/029031.

(Continued)

*Primary Examiner* — David Warren
*Assistant Examiner* — Robert W Horn

(57) ABSTRACT

A apparatus and method for determining an operating state of an earpiece of a personal acoustic device and/or the entirety of the personal acoustic device by analyzing signals output by at least an inner microphone disposed within a cavity of a casing of the earpiece and an outer microphone disposed on the personal acoustic device in a manner acoustically coupling it to the environment outside the casing of the earpiece.

14 Claims, 10 Drawing Sheets

U.S. PATENT DOCUMENTS

| | | | | |
|---|---|---|---|---|
| 2007/0076897 | A1 | 4/2007 | Philipp | |
| 2007/0160255 | A1 | 7/2007 | Cheng et al. | |
| 2007/0274530 | A1 | 11/2007 | Buil et al. | |
| 2007/0297618 | A1* | 12/2007 | Nurmi et al. | 381/71.6 |
| 2007/0297634 | A1 | 12/2007 | Hansson | |
| 2008/0192942 | A1 | 8/2008 | Yamkovoy et al. | |
| 2008/0260176 | A1 | 10/2008 | Hollemans et al. | |
| 2009/0154720 | A1 | 6/2009 | Oki | |
| 2009/0268936 | A1 | 10/2009 | Goldberg et al. | |
| 2010/0054518 | A1 | 3/2010 | Goldin | |
| 2010/0128887 | A1 | 5/2010 | Lee et al. | |
| 2010/0183183 | A1 | 7/2010 | Bae et al. | |
| 2010/0246845 | A1* | 9/2010 | Burge et al. | 381/71.6 |
| 2010/0246846 | A1* | 9/2010 | Burge et al. | 381/74 |
| 2010/0246847 | A1* | 9/2010 | Johnson et al. | 381/74 |
| 2011/0144779 | A1 | 6/2011 | Janse et al. | |
| 2011/0293129 | A1 | 12/2011 | Dillen et al. | |
| 2012/0002822 | A1 | 1/2012 | Peissig et al. | |

FOREIGN PATENT DOCUMENTS

| | | | |
|---|---|---|---|
| EP | 0363056 | A2 | 4/1990 |
| EP | 1059635 | A2 | 12/2000 |
| EP | 1465454 | A2 | 10/2004 |
| JP | 07298383 | A | 11/1995 |
| WO | 2007/049255 | | 5/2007 |
| WO | 2007/110807 | | 10/2007 |
| WO | 2007/141769 | A2 | 12/2007 |
| WO | 2008096125 | A2 | 8/2008 |

OTHER PUBLICATIONS

International Preliminary Report on Patentability dated Jun. 1, 2010 for PCT/US2009/035826.

Invitation to Pay Additional Fees dated May 26, 2010 for PCT/US10/029031.

EP Examination report dated Mar. 15, 2011 for EP Appln. No. 09719786.7.

International Search Report and Written Opinion dated Jun. 16, 2009 for PCT/US2009/035826.

* cited by examiner

PERSONAL ACOUSTIC DEVICE POSITION DETERMINATION

TECHNICAL FIELD

This disclosure relates to the determination of the positioning of at least one earpiece of a personal acoustic device relative to an ear of a user to acoustically output a sound to that ear and/or to alter an environmental sound reaching that ear.

BACKGROUND

It has become commonplace for those who either listen to electronically provided audio (e.g., audio from a CD player, a radio or a MP3 player), those who simply seek to be acoustically isolated from unwanted or possibly harmful sounds in a given environment, and those engaging in two-way communications to employ personal acoustic devices (i.e., devices structured to be positioned in the vicinity of at least one of a user's ears) to perform these functions. For those who employ headphones or headset forms of personal acoustic devices to listen to electronically provided audio, it has become commonplace for that audio to be provided with at least two audio channels (e.g., stereo audio with left and right channels) to be separately acoustically output with separate earpieces to each ear. Further, recent developments in digital signal processing (DSP) technology have enabled such provision of audio with various forms of surround sound involving multiple audio channels. For those simply seeking to be acoustically isolated from unwanted or possibly harmful sounds, it has become commonplace for acoustic isolation to be achieved through the use of active noise reduction (ANR) techniques based on the acoustic output of anti-noise sounds in addition to passive noise reduction (PNR) techniques based on sound absorbing and/or reflecting materials. Further, it has become commonplace to combine ANR with other audio functions in headphones, headsets, earphones, earbuds, and wireless headsets (also known as "earsets").

Yet, despite these many advances, issues of user safety and ease of use of many personal acoustic devices remain unresolved. More specifically, controls mounted upon or otherwise connected to a personal acoustic device that are normally operated by a user upon either positioning the personal acoustic device in the vicinity of one or both ears or removing it therefrom (e.g., a power switch) are often undesirably cumbersome to use. The cumbersome nature of controls of a personal acoustic device often arises from the need to minimize the size and weight of such personal acoustic devices by minimizing the physical size of such controls. Also, controls of other devices with which a personal acoustic device interacts are often inconveniently located relative to the personal acoustic device and/or a user. Further, regardless of whether such controls are in some way carried by the personal acoustic device, itself, or by another device with which the personal acoustic device interacts, it is commonplace for users to forget to operate such controls when they do position the acoustic device in the vicinity of one or both ears or remove it therefrom.

Various enhancements in safety and/or ease of use may be realized through the provision of an automated ability to determine the positioning of a personal acoustic device relative to one or both of the user's ears.

SUMMARY

A apparatus and method for determining an operating state of an earpiece of a personal acoustic device and/or the entirety of the personal acoustic device by analyzing signals output by at least an inner microphone disposed within a cavity of a casing of the earpiece and an outer microphone disposed on the personal acoustic device in a manner acoustically coupling it to the environment outside the casing of the earpiece.

In one aspect, a method entails analyzing an inner signal output by an inner microphone disposed within a cavity of a casing of an earpiece of a personal acoustic device and an outer signal output by an outer microphone disposed on the personal acoustic device so as to be acoustically coupled to an environment external to the casing of the earpiece, and determining an operating state of the earpiece based on the analyzing of the inner and outer signals.

Implementations may include, and are not limited to, one or more of the following features. Determining the operating state of the earpiece may entail determining whether the earpiece is in an operating state of being positioned in the vicinity of an ear of a user such that the cavity is acoustically coupled to an ear canal, or is in an operating state of not being positioned in the vicinity of an ear of the user such that the cavity is acoustically coupled to the environment external to the casing. Analyzing the inner and outer signals may entail comparing a signal level of the inner signal within a selected range of frequencies to a signal level of the outer signal within the selected range of frequencies, and determining the operating state of the earpiece may entail determining that the earpiece is in the operating state of being positioned in the vicinity of an ear at least partly in response to detecting that the difference between the signal levels of the inner signal and the outer signal within the selected range of frequencies is within a maximum degree of difference specified by a difference threshold setting. The method may further entail imposing a transfer function on the outer signal that modifies a sound represented by the outer signal in a manner substantially similar to the manner in which a sound propagating from the environment external to the casing to the cavity is modified at a time when the earpiece is in the operating state of being positioned in the vicinity of an ear, and the transfer function may be based at least partly on the manner in which ANR provided by the personal acoustic device modifies a sound propagating from the environment external to the casing to the cavity.

Analyzing the inner and outer signals may entail analyzing a difference between a first transfer function representing the manner in which a sound emanating from an acoustic noise source in the environment external to the casing changes as it propagates from the noise source to the inner microphone within the cavity and a second transfer function representing the manner in which the sound changes as it propagates from the noise source to the outer microphone by deriving a third transfer function that is at least indicative of the difference between the first and second transfer functions. Determining the operating state of the earpiece may entail either determining that the difference between the third transfer function and one of a first stored transfer function corresponding to the operating state of being positioned in the vicinity of an ear and a second stored transfer function corresponding to the operating state of not being positioned in the vicinity of an ear is within a maximum degree of difference specified by a difference threshold setting, or may entail determining that at least one characteristic of the third transfer function is closer to a corresponding characteristic of one of a first stored transfer function corresponding to the operating state of being positioned in the vicinity of an ear and a second stored transfer function corresponding to the operating state of not being positioned in the vicinity of an ear than to the other. The method may further entail acoustically outputting electronically provided audio into the cavity through an acoustic driver at least partly disposed within the cavity, monitoring a signal level of the outer signal, deriving a fourth transfer function representing the manner in which the electronically provided audio acoustically output by the acoustic driver changes as it propagates from the acoustic driver to the inner microphone, and determining the operating state of the earpiece based, at least in part, on analyzing a characteristic of the fourth transfer function. Further, determining the operating state of the earpiece may be based on either analyzing a difference between the inner signal and outer signal or analyzing a characteristic of the fourth transfer function, depending on at least one of whether the signal level of the outer signal at least meets a minimum level setting and whether electronically provided audio is currently being acoustically output into the cavity.

The method may further entail determining that a change in operating state of the earpiece has occurred and determining that the entirety of the personal acoustic device has changed operating states among at least an operating state of being positioned on or about the user's head and an operating state of not being positioned on or about the user's head. The method may further entail determining that a change in operating state of the earpiece has occurred, and taking an action in response to determining that a change in operating state of the earpiece has occurred. Further, the taken action may be one of altering provision of power to a portion of the personal acoustic device; altering provision of ANR by the personal acoustic device; signaling another device with which the personal acoustic device is in communication with an indication of the current operating state of at least the earpiece of the personal acoustic device; muting a communications microphone of the personal acoustic device; and rerouting audio to be acoustically output by an acoustic driver of the earpiece to being acoustically output by another acoustic driver of another earpiece of the personal acoustic device.

In one aspect, a personal acoustic device comprises a first earpiece having a first casing; a first inner microphone disposed within a first cavity of the first casing and outputting a first inner signal representative of sounds detected by the first inner microphone; a first outer microphone disposed on the personal acoustic device so as to be acoustically coupled to an environment external to the first casing and outputting a first outer signal representative of sounds detected by the first outer microphone; and a control circuit coupled to the first inner microphone and to the first outer microphone to receive the first inner signal and the first outer signal, to analyze a difference between the first inner signal and the first outer signal, and to determine an operating state of the first earpiece based, at least in part, on analyzing the difference between the first inner signal and the first outer signal.

Implementations may include, and are not limited to, one or more of the following features. The control circuit may determine the operating state of the earpiece by at least determining whether the earpiece is in an operating state of being positioned in the vicinity of an ear of a user such that the first cavity is acoustically coupled to an ear canal, or in an operating state of not being positioned in the vicinity of an ear of the user such that the first cavity is acoustically coupled to the environment external to the first casing. The first earpiece may be in the form of an in-ear earphone, an on-ear earcup, an over-the-ear earcup, or an earset. The personal acoustic device may be listening headphones, noise reduction headphones, a two-way communications headset, earphones, earbuds, a two-way communications earset, ear protectors, a hat incorporating earpieces, and a helmet incorporating earpieces. The personal acoustic device may incorporate a communications microphone disposed on the personal acoustic device so as to detect speech sounds of the user, or the first outer microphone may be a communications microphone.

The personal acoustic device may further incorporate a second earpiece having a second casing and a second inner microphone disposed within a second cavity of the second casing and outputting a second inner signal representative of sounds detected by the second inner microphone. Also, the personal acoustic device may further incorporate a second outer microphone disposed on the personal acoustic device so as to be acoustically coupled to an environment external to the second casing and outputting a second outer signal representative of sounds detected by the second outer microphone. Further, the control circuit may be further coupled to the second inner microphone and to the second outer microphone to receive the second inner signal and the second outer signal, to analyze a difference between the second inner signal and the second outer signal, and to determine an operating state of the second earpiece based, at least in part, on analyzing the difference between the second inner signal and the second outer signal. Alternatively, the control circuit is further coupled to the second inner microphone to receive the second inner signal, to analyze a difference between the second inner signal and the first outer signal, and to determine the state of the second earpiece between the state of being positioned in the vicinity of the other ear of the user such that the second cavity is acoustically coupled to an ear canal and the state of not being positioned in the vicinity of the other ear of the user such that the second cavity is acoustically coupled to the environment external to the second casing based, at least in part, on the analyzing of a difference between the second inner signal and the first outer signal.

The personal acoustic device may further incorporate a power source providing power to a component of the personal acoustic device and coupled to the control circuit, wherein the control circuit signals the power source to alter its provision of power to the component in response to the control circuit determining that a change in operating state of at least the first earpiece has occurred. The personal acoustic device may further incorporate an ANR circuit enabling the personal acoustic device to provide ANR and coupled to the control circuit, wherein the control circuit signals the ANR circuit to alter its provision of ANR in response to the control circuit determining that a change in operating state of at least the first earpiece has occurred. The personal acoustic device may further incorporate an interface enabling the personal acoustic device to communicate with another device and coupled to the control circuit, wherein the control circuit operates the interface to signal the other device with an indication that a change in operating state of at least the first earpiece has occurred in response to the control circuit determining that a change in operating state of at least the first earpiece has occurred. The personal acoustic device may further incorporate an audio controller coupled to the control circuit, wherein the control circuit, in response to determining that a change in operating state of at least the first earpiece has occurred, operates the audio controller to take an action selected from the group of actions consisting of muting audio detected by a communications microphone of the personal acoustic device, and rerouting audio to be acoustically output by a first acoustic driver of the first earpiece to being acoustically output by a second acoustic driver of a second earpiece of the personal acoustic device.

In one aspect, an apparatus comprises a first microphone disposed within a cavity of a casing of an earpiece of a personal acoustic device to detect an acoustic signal and to output a first signal representing the acoustic signal as detected by the first microphone; a second microphone disposed on the personal acoustic device so as to be acoustically coupled to the environment external to the casing of the earpiece to detect the acoustic signal and to output a second signal representing the acoustic signal as detected by the second microphone; an adaptive filter to filter one of the first and second signals, wherein the adaptive filter adapts filter coefficients according to an adaptation algorithm selected to reduce signal power of an error signal; a differential summer to subtract the one of the first and second signals from the other of the first and second signals to derive the error signal; a storage in which is stored predetermined adaptive filter parameters representative of a known operating state of the personal acoustic device; and a controller for comparing adaptive filter parameters derived by the adaptive filter through the adaptation algorithm to the predetermined adaptive filter parameters stored in the storage.

Implementations may include, and are not limited to, one or more of the following features. The adaptive filter parameters derived by the adaptive filter may be the filter coefficients adapted by the adaptive filter, or may represent a frequency response of the adaptive filter corresponding to the filter coefficients adapted by the adaptive filter.

Other features and advantages of the invention will be apparent from the description and claims that follow.

DETAILED DESCRIPTION

What is disclosed and what is claimed herein is intended to be applicable to a wide variety of personal acoustic devices, i.e., devices that are structured to be used in a manner in which at least a portion of the devices is positioned in the vicinity of at least one of the user's ears, and that either acoustically output sound to that at least one ear or manipulate an environmental sound reaching that at least one ear. It should be noted that although various specific implementations of personal acoustic devices, such as listening headphones, noise reduction headphones, two-way communications headsets, earphones, earbuds, wireless headsets (also known as "earsets") and ear protectors are presented with some degree of detail, such presentations of specific implementations are intended to facilitate understanding through examples, and should not be taken as limiting either the scope of disclosure or the scope of claim coverage.

It is intended that what is disclosed and what is claimed herein is applicable to personal acoustic devices that provide active noise reduction (ANR), passive noise reduction (PNR), or a combination of both. It is intended that what is disclosed and what is claimed herein is applicable to personal acoustic devices that provide two-way communications, provide only acoustic output of electronically provided audio (including so-called "one-way communications"), or no output of audio, at all, be it communications audio or otherwise. It is intended that what is disclosed and what is claimed herein is applicable to personal acoustic devices that are wirelessly connected to other devices, that are connected to other devices through electrically and/or optically conductive cabling, or that are not connected to any other device, at all. It is intended that what is disclosed and what is claimed herein is applicable to personal acoustic devices having physical configurations structured to be worn in the vicinity of either one or both ears of a user, including and not limited to, headphones with either one or two earpieces, over-the-head headphones, behind-the-neck headphones, headsets with communications microphones (e.g., boom microphones), wireless headsets (earsets), single earphones or pairs of earphones, as well as hats or helmets incorporating earpieces to enable audio communication and/or to enable ear protection. Still other implementations of personal acoustic devices to which what is disclosed and what is claimed herein is applicable will be apparent to those skilled in the art.

Figure 1A:
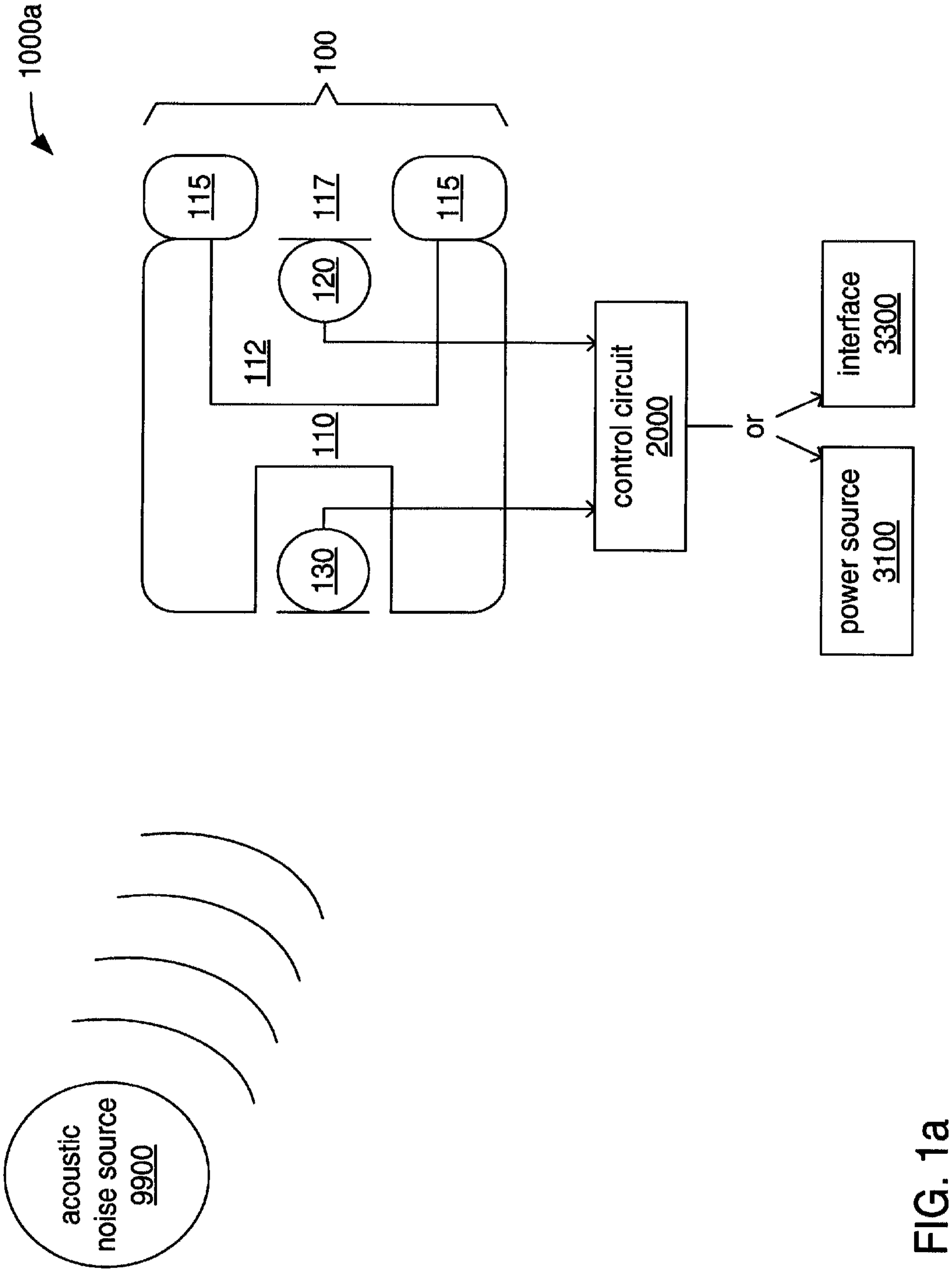
FIGS. 1*a* and 1*b* are block diagrams of portions of possible implementations of personal acoustic devices.
Figure 1B:
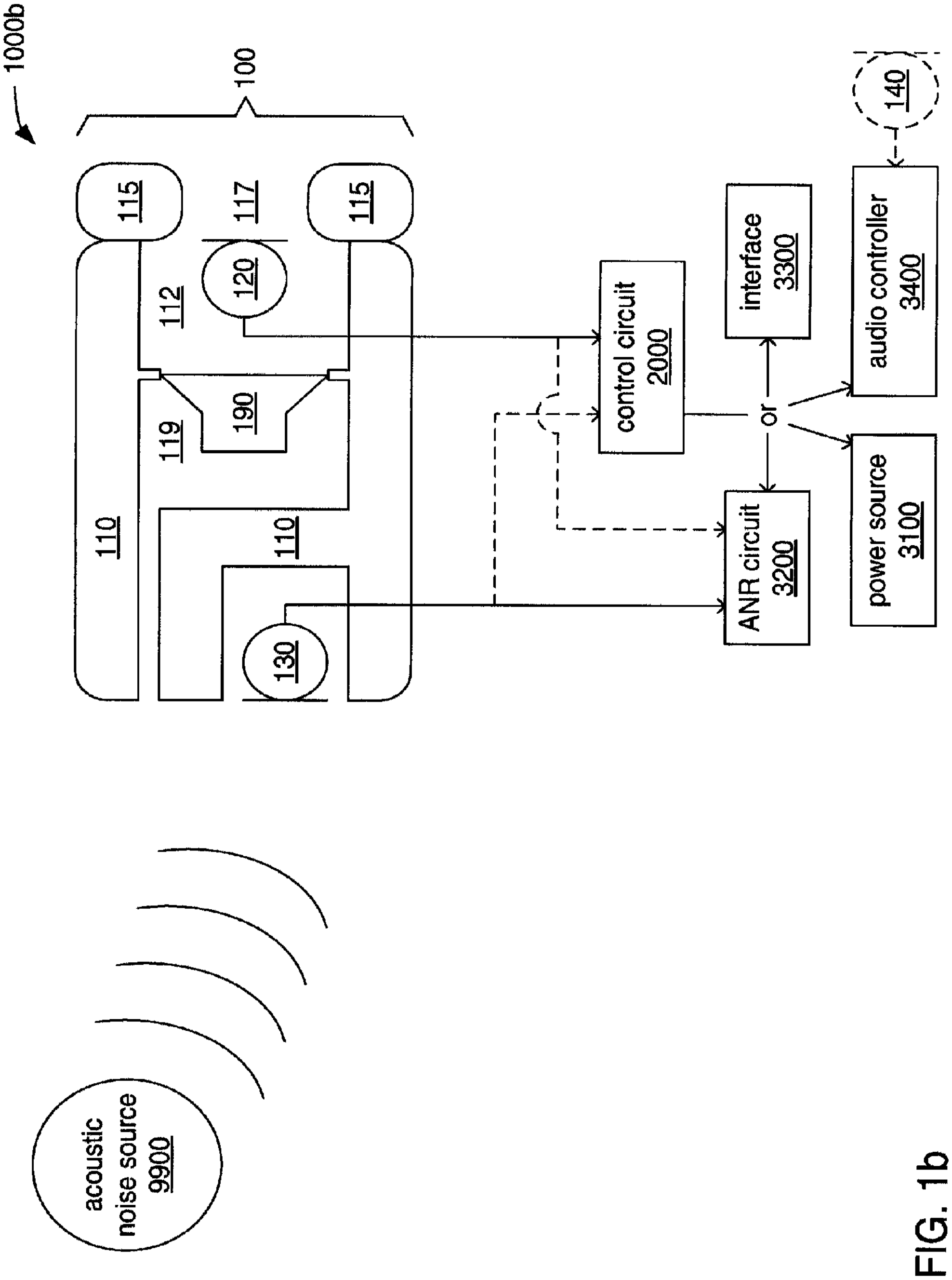

FIGS. 1*a* and 1*b* provide block diagrams of at least a portion of two possible implementations of personal acoustic devices 1000*a* and 1000*b*, respectively. As will be explained in greater detail, recurring analyses are made of sounds detected by different microphones to determine the current operating state of one or more earpieces a personal acoustic device (such as either of the personal acoustic devices 1000*a* or 1000*b*), where the possible operating states of each earpiece are: 1) being positioned in the vicinity of an ear, and 2) not being positioned in the vicinity of an ear. Through such recurring analyses of the current operating state of one or more earpieces, further determinations of whether or not a change in operating state of one or more earpieces has occurred. Through determining the current operating state and/or through determining whether there has been a change in operating state of one or more earpieces, the current operating state and/or whether there has been a change in operating state of the entirety of a personal acoustic device are is determined, where the possible operating states of a personal acoustic drive are: 1) being fully positioned on or about a user's head, 2) being partially positioned on or about the user's head, and 3) not being in position on or about the user's head, at all. These analyses rely on the presence of environmental noise sounds that are detectable by the different microphones, including and not limited to, the sound of the wind, rustling leaves, air blowing through vents, footsteps, breathing, clothes rubbing against skin, running water, structural creaking, animal vocalizations, etc. For purposes of the discussion to follow, the acoustic noise source 9900 depicted in FIGS. 1*a* and 1*b* represents a source of environmental noise sounds.

As will also be explained in greater detail, each of the personal acoustic devices 1000*a* and 1000*b* may have any of a number of physical configurations. FIGS. 2*a* through 2*d* depict possible physical configurations that may be employed by either of the personal acoustic devices 1000*a* and 1000*b*. Some of these depicted physical configurations incorporate a single earpiece 100 to engage only one of the user's ears, and others incorporate a pair of earpieces 100 to engage both of the user's ears. However, it should be noted that for the sake of simplicity of discussion, only a single earpiece 100 is depicted and described in relation to each of FIGS. 1*a* and 1*b*. Each of the personal acoustic devices 1000*a* and 1000*b* incorporates at least one control circuit 2000 that compares sounds detected by different microphones, and that takes any of a variety of possible actions in response to determining that an earpiece 100 and/or the entirety of the personal acoustic device 1000*a* or 1000*b* is in a particular operating state, and/or in response to determining that a particular change in operating state has occurred. FIGS. 3*a* through 3*f* depict possible electrical architectures that may be adopted by the control circuit 2000.

As depicted in FIG. 1*a*, each earpiece 100 of the personal acoustic device 1000*a* incorporates a casing 110 defining a cavity 112 in which at least an inner microphone 120 is disposed. Further, the casing 110 carries an ear coupling 115 that surrounds an opening to the cavity 112. A passage 117 is formed through the ear coupling 115 and communicates with the opening to the cavity 112. In some implementations, an acoustically transparent screen, grill or other form of perforated panel (not shown) may be positioned in or near the passage 117 in a manner that obscures the inner microphone 120 from view either for aesthetic reasons or to protect the microphone 120 from damage. The casing 110 also carries an outer microphone 130 disposed on the casing 110 in a manner that is acoustically coupled to the environment external to the casing 110.

When the earpiece 100 is correctly positioned in the vicinity of a user's ear, the ear coupling 115 of that earpiece 100 is caused to engage portions of that ear and/or portions of the user's head adjacent that ear, and the passage 117 is positioned to face the entrance to the ear canal of that ear. As a result, the cavity 112 and the passage 117 are acoustically coupled to the ear canal. Also as a result, at least some degree of acoustic seal is formed between the ear coupling 115 and the portions of the ear and/or the head of the user that the ear coupling 115 engages. This acoustic seal acoustically isolates the now acoustically coupled cavity 112, passage 117 and ear canal from the environment external to the casing 110 and the user's head, at least to some degree. This enables the casing 110, the ear coupling 115 and portions of the ear and/or the user's head to cooperate to provide some degree of passive noise reduction (PNR). As a result, a sound emitted from the acoustic noise source 9900 at a location external to the casing 110 is attenuated to at least some degree before reaching the cavity 112, the passage 117 and the ear canal.

However, when the earpiece 100 is removed from the vicinity of a user's ear user such that the ear coupling 115 is no longer engaged by portions of that ear and/or of the user's head, both the cavity 112 and the passage 117 are acoustically coupled to the environment external to the casing 110. This reduces the ability of the earpiece 100 to provide PNR, which allows a sound emitted from the acoustic noise source 9900 to reach the cavity 112 and the passage 117 with less attenuation. As those skilled in the art will readily recognize, the recessed nature of the cavity 112 may continue to provide at least some degree of attenuation (in one or more frequency ranges) of a sound from the acoustic noise source 9900 entering into the cavity 112, but the degree of attenuation is still less than when the earpiece is correctly positioned in the vicinity of an ear.

Therefore, as the earpiece 100 changes operating states between being positioned in the vicinity of an ear and not being so positioned, the placement of the inner microphone 120 within the cavity 112 enables the inner microphone 120 to provide a signal reflecting the resulting differences in attenuation as the inner microphone 120 detects a sound emanating from the acoustic noise source 9900. Further, the placement of the outer microphone 130 on or within the casing 110 in a manner acoustically coupled to the environment external to the casing 110 enables the outer microphone 130 to detect the same sound from the acoustic noise source 9900 without the changing attenuation encountered by the inner microphone 120. Therefore, the outer microphone 130 is able to provide a reference signal representing the same sound substantially unchanged by changes in the operating state of the earpiece 100.

The control circuit 2000 receives both of these microphone output signals, and as will be described in greater detail, employs one or more techniques to examine differences between at least these signals in order to determine whether the earpiece 100 is in the operating state of being positioned in the vicinity of an ear, or is in the operating state of not being positioned in the vicinity of an ear. Where the personal acoustic device 1000*a* incorporates only one earpiece 100, determining the operating state of the earpiece 100 may be equivalent to determining whether the entirety of the personal acoustic device 1000*a* is in the operating state of being positioned on or about the user's head, or is in the operating state of not being so positioned. The determination of the operating state of the earpiece 100 and/or of the entirety of the personal acoustic device 1000*a* by the control circuit 2000 enables the control circuit 2000 to further determine when a change in operating state has occurred. As will also be described in greater detail, various actions may be taken by the control circuit 2000 in response to determining that a change in operating state of the earpiece 100 and/or the entirety of the personal acoustic device 1000*a* has occurred.

However, where the personal acoustic device 1000*a* incorporates two earpieces 100, separate examinations of differences between signals provided by the inner microphone 120 and the outer microphone 130 of each of the two earpieces 100 may enable more complex determinations of the operating state of the entirety of the personal acoustic device 1000*a*. In some implementations, the control circuit 2000 may be configured such that determining that at least one of the earpieces 100 is positioned in the vicinity of an ear leads to a determination that the entirety of the personal acoustic device 1000*a* is in the operating state of being positioned on or about a user's head. In such implementations, as long as the control circuit 2000 continues to determine that one of the earpieces 100 is in the operating state of being positioned in the vicinity of an ear, any determination that a change in operating state of the other of the earpieces 100 has occurred will not alter the determination that the personal acoustic device 1000*a* is in the operating state of being positioned on or about a user's head. In other implementations, the control circuit 2000 may be configured such that a determination that either of the earpieces 100 is in the operating state of not being positioned in the vicinity of an ear leads to a determination that the entirety of the personal acoustic device 1000*a* is in the operating state of not being positioned on or about a user's head. In still other implementations, only one of the two earpieces 100 incorporates the inner microphone 120 and the outer microphone 130, and the control circuit 2000 is configured such that determining whether this one earpiece 100 is in the operating state of being positioned in the vicinity of an ear, or not, leads to a determination of whether the entirety of the personal acoustic device 1000*a* is in the operating state of being positioned on or about a user's head, or not.

As depicted in FIG. 1*b*, the personal acoustic device 1000*b* is substantially similar to the personal acoustic device 1000*a*, but with the difference that the earpiece 100 of the personal acoustic device 1000*b* additionally incorporates at least an acoustic driver 190. In some implementations (and as depicted in FIG. 1*b*), the acoustic driver 190 is positioned within the casing 110 in a manner in which at least a portion of the acoustic driver 190 partially defines the cavity 112 along with portions of the casing 110. This manner of positioning the acoustic driver 190 creates another cavity 119 within the casing 110 that is separated from the cavity 112 by the acoustic driver 190. As will be explained in greater detail, in some implementations, the acoustic driver 190 is employed to acoustically output electronically provided audio received from other devices (not shown), and/or to acoustically output internally generated sounds, including ANR anti-noise sounds.

In some variations, the cavity 119 may be coupled to the environment external to the casing 110 via one or more acoustic ports (only one of which is shown), each tuned by their dimensions to a selected range of audible frequencies to enhance characteristics of the acoustic output of sounds by the acoustic driver 190 in a manner readily recognizable to those skilled in the art. Also, in some variations, one or more tuned ports (not shown) may couple the cavities 112 and 119, and/or may couple the cavity 112 to the environment external to the casing 110. Although not specifically depicted, acoustically transparent screens, grills or other forms of perforated or fibrous structures may be positioned within one or more of such ports to prevent passage of debris or other contaminants therethrough, and/or to provide some level of acoustical resistance.

As is also depicted in FIG. 1*b*, the personal acoustic device 1000*b* may further differ from the personal acoustic device 1000*a* by further incorporating a communications microphone 140 to enable two-way communications by detecting sounds in the vicinity of a user's mouth. Therefore, the communications microphone 140 is able to provide a signal representing a sound from the vicinity of the user's mouth as detected by the communications microphone 140. As will be described in greater detail, signals representing various sounds, including sounds detected by the communications microphone 140 and sounds to be acoustically output by the acoustic driver 190, may be altered in one or more ways under the control of the control circuit 2000. Although the communications microphone 140 is depicted as being a separate and distinct microphone from the outer microphone 130, it should also be noted that in some implementations, the outer microphone 130 and the communications microphone 140 may be one and the same microphone. Thus, in some implementations, a single microphone may be employed both in supporting two-way communications and in determining the operating state of the earpiece 100 and/or of the entirety of the personal acoustic device 1000*b*.

Since the personal acoustic device 1000*b* incorporates the acoustic driver 190 while the personal acoustic device 1000*a* does not, implementations of the personal acoustic device 1000*b* are possible in which ANR functionality is provided. As those skilled in the art will readily recognize, the formation of the earlier described acoustic seal at times when the earpiece 100 is positioned in the vicinity of an ear makes the provision of ANR easier and more effective. Acoustically coupling the cavity 112 and the passage 117 to the environment external to the casing 110, as occurs when the earpiece 100 is not so positioned, decreases the effectiveness of both feedback-based and feedforward-based ANR. Therefore, regardless of whether implementations of the personal acoustic device 1000*b* provide ANR, or not, the degree of attenuation of environmental noise sounds as detected by the inner microphone 120 continues to be greater when the earpiece 100 is positioned in the vicinity of an ear than when the earpiece 100 is not so positioned. Thus, analyses of the signals output by the inner microphone 120 and the outer microphone 130 by the control circuit 2000 may still be used to determine whether changes in the operating state of an earpiece 100 and/or of the entirety of the personal acoustic device 1000*b* have occurred, regardless of whether or not ANR is provided.

The control circuit 2000 in either of the personal acoustic devices 1000*a* and 1000*b* may take any of a number of actions in response to determining that a single earpiece 100 and/or the entirety of the personal acoustic device 1000*a* or 1000*b* is currently in a particular operating state and/or in response to determining that a change in operating state of a single earpiece 100 and/or of the entirety of the personal acoustic device 1000*a* or 1000*b* has occurred. The exact nature of the actions taken may depend on the functions performed by the personal acoustic device 1000*a* or 1000*b*, and/or whether the personal acoustic device 1000*a* or 1000*b* has one or two of the earpieces 100. In support of the control circuit 2000 taking such actions, each of the personal acoustic devices 1000*a* and 1000*b* may further incorporate one or more of a power source 3100 controllable by the control circuit 2000, an ANR circuit 3200 controllable by the control circuit 2000, an interface 3300 and an audio controller 3400 controllable by the control circuit 2000. It should be noted that for the sake of simplicity of depiction and discussion, interconnections between the acoustic driver 190 and either of the ANR circuit 3200 and the audio controller 3400 have been intentionally omitted. Interconnections to convey signals representing ANR anti-noise sounds and/or electronically provided audio to the acoustic driver 190 for being acoustically output are depicted and described in considerable detail, elsewhere.

Where either of the personal acoustic devices 1000*a* and 1000*b* incorporates a power source 3100 having limited capacity to provide power (e.g., a battery), the control circuit 2000 may signal the power source 3100 to turn on, turn off or otherwise alter its provision of power in response to determining that a particular operating state is the current operating state and/or that a change in operating state has occurred. Additionally and/or alternatively, where either of the personal acoustic devices 1000*a* and 1000*b* incorporates an ANR circuit 3200 to provide ANR functionality, the control circuit 2000 may similarly signal the ANR circuit 3200 to turn on, turn off or otherwise alter its provision of ANR. By way of example, where the personal acoustic device 1000*b* is a pair of headphones employing the acoustic driver 190 of each the earpieces 100 to providing ANR and/or acoustic output of audio from an audio source (not shown), the control circuit 2000 may operate the power source 3100 to save power by reducing or entirely turning off the provision of power to other components of the personal acoustic device 1000*b* in response to determining that there has been a change in operating state of the personal acoustic device 1000*b* from being positioned on or about the user's head to no longer being so positioned. Alternatively and/or additionally, the control circuit 2000 may operate the power source 3100 to save power in response to determining that the entirety of the personal acoustic device 1000*b* has been in the state of not being positioned on or about a user's head for at least a predetermined period of time. In some variations, the control circuit 2000 may also operate the power source 3100 to again provide power to other components of the acoustic device 1000*b* in response to determining that there has been a change in operating state of the personal acoustic device 1000*b* to again being positioned on or about the head of the user. Among the other components to which the provision of power by the power source 3100 may be altered may be the ANR circuit 3200. Alternatively, the control circuit 2000 may directly signal the ANR circuit 3200 to reduce, cease and/or resume its provision of ANR.

Where either of the personal acoustic devices 1000*a* and 1000*b* incorporates a interface 3300 capable of signaling another device (not shown) to control an interaction with that other device to perform a function, the control circuit 2000 may operate the interface 3300 to signal the other device to turn on, turn off, or otherwise alter the interaction in response to determining that a change in operating state has occurred. By way of example, where the personal acoustic device 1000*b* is a pair of headphones providing acoustic output of audio from the other device (e.g., a CD or MP3 audio file player, a cell phone, etc.), the control circuit 2000 may operate the interface 3300 to signal the other device to pause the playback of recorded audio through the personal acoustic device 1000*b* in response to determining that there has been a change in operating state of the personal acoustic device 1000*b* from being positioned on or about the user's head to no longer being so positioned. In some variations, the control circuit 2000 may also operate the interface 3300 to signal the other device to resume such playback in response to determining that there has been another change in operating state such that the personal acoustic device 1000*b* is once again positioned on or about the user's head. This may be deemed to be a desirable convenience feature for the user, allowing the user's enjoyment of an audio recording to be automatically paused and resumed in response to instances where the user momentarily removes the personal acoustic device 1000*b* from their head to talk with someone in their presence. By way of another example, where the personal acoustic device 1000*a* is a pair of ear protectors meant to be used with another device that produces potentially injurious sound levels during operation (e.g., a piece of construction, mining or manufacturing machinery), the control circuit 2000 may operate the interface 3300 to signal the other device as to whether or not the personal acoustic device 1000*a* is currently in the operating state of being positioned on or about the user's head. This may be done as part of a safety feature of the other device in which operation of the other device is automatically prevented unless there is an indication received from the personal acoustic device 1000*a* that the operating state of the personal acoustic device 1000*a* has changed to the personal acoustic device 1000*a* being positioned on or about the user's head, and/or that the personal acoustic device 1000*a* is currently in the state of being positioned on or about the user's head such that its earpieces 100 are able to provide protection to the user's hearing during operation of the other device.

Where either of the personal acoustic devices 1000*a* and 1000*b* incorporates an audio controller 3400 capable of modifying signals representing sounds that are acoustically output and/or detected, the control circuit 2000 may signal the audio controller 3400 to reroute, mute or otherwise alter sounds represented by one or more signals. By way of example, where the personal acoustic device 1000*b* is a pair of headphones providing acoustic output of audio from another device, the control circuit 2000 may signal the audio controller 3400 to reroute a signal representing sound being acoustically output by the acoustic driver 190 of one of the earpieces 100 to the acoustic driver 190 of the other of the earpieces 100 in response to determining that the one of the earpieces 100 has changed and is no longer in the operating state of being positioned in the vicinity of an ear, but that the other of the earpieces 100 still is (i.e., in response to determining that the entirety of the personal acoustic device 1000*a* or 1000*b* is in the state of being partially in place on or about the head of a user). A user may deem it desirable to have both left and right audio channels of stereo audio momentarily directed to whichever one of the earpieces 100 that is still in the operating state of positioned in the vicinity of one of the user's ears as the user momentarily changes the state of the other of the earpieces 100 by momentarily pulling the other of the earpieces 100 away from the other ear to momentarily talk with someone in their presence. By way of another example, where the personal acoustic device 1000*b* is a headset that further incorporates the communications microphone 140 to support two-way communications, the control circuit 2000 may signal the audio controller 3400 to mute whatever sounds are detected by the communications microphone 140 to enhance user privacy in response to determining that the personal acoustic device 1000*b* is not in the state of being positioned on or about the user's head, and to cease to mute that signal in response to determining that the personal acoustic device 1000*b* is once again in the state of being so positioned.

It should be noted that where either of the personal acoustic devices 1000*a* and 1000*b* interact with another device to signal the other device to control the interaction with that other device, to receive a signal representing sounds from the other device, and/or to transmit a signal representing sounds to the other device, any of a variety of technologies to enable such signaling may be employed. More specifically, the interface 3300 may employ any of a variety of wireless technologies (e.g., infrared, radio frequency, etc.) to signal the other device, or may signal the other device via a cable incorporating electrical and/or optical conductors that is coupled to the other device. Similarly, the exchange of signals representing sounds with another device may employ any of a variety of cable-based or wireless technologies.

It should be noted that the electronic components of either of the personal acoustic devices 1000*a* and 1000*b* may be at least partially disposed within the casing 110 of at least one earpiece 100. Alternatively, the electronic components may be at least partially disposed within another casing that is coupled to at least one earpiece 100 of the personal acoustic device 1000*a* or 1000*b* through a wired and/or wireless connection. More specifically, the casing 110 of at least one earpiece 100 may carry one or more of the control circuit 2000, the power source 3100, the ANR circuit 3200, the interface 3300, and/or the audio controller 3400, as well as other electronic components that may be coupled to any of the inner microphone 120, the outer microphone 130, the communications microphone 140 (where present) and/or the acoustic driver 190 (where present). Further, in implementations having more than one of the earpieces 100, wired and/or wireless connections may be employed to enable signaling between electronic components disposed among the two casings 110. Still further, although the outer microphone 130 is depicted and discussed as being disposed on the casing 110, and although this may be deemed desirable in implementations where the outer microphone 130 also serves to provide input to the ANR circuit 3200 (where present), other implementations are possible in which the outer microphone 130 is disposed on another portion of either of the personal acoustic devices 1000*a* and 1000*b*.

FIGS. 2*a* through 2*d* depict various possible physical configurations that may be adopted by either of the personal acoustic devices 1000*a* and 1000*b* of FIGS. 1*a* and 1*b*, respectively. As previously discussed, different implementations of either of the personal acoustic devices 1000*a* and 1000*b* may have either one or two earpieces 100, and are structured to be positioned on or near a user's head in a manner that enables each earpiece 100 to be positioned in the vicinity of an ear.

Figure 2A:
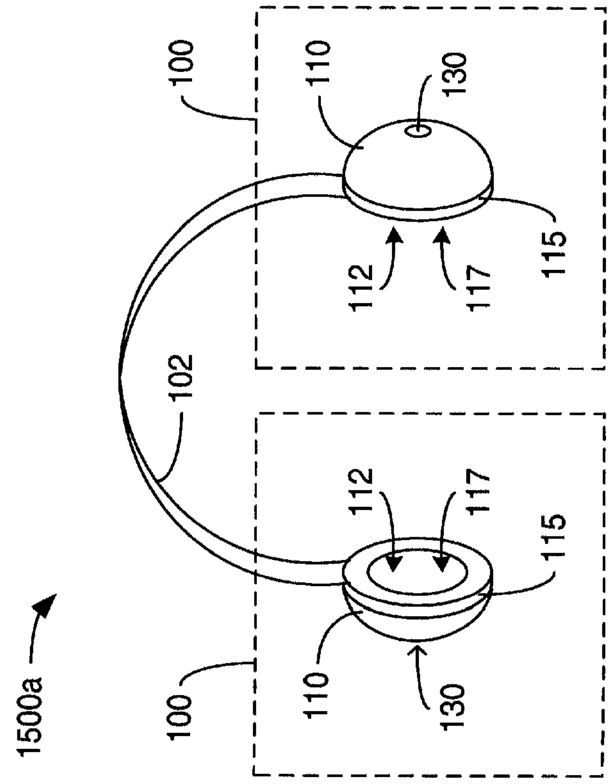
FIGS. 2*a* through 2*d* depict possible physical configurations of personal acoustic devices having either one or two earpieces.

FIG. 2*a* depicts an "over-the-head" physical configuration 1500*a* that incorporates a pair of earpieces 100 that are each in the form of an earcup, and that are connected by a headband 102 structured to be worn over the head of a user. However, and although not specifically depicted, an alternate variant of the physical configuration 1500*a* may incorporate only one of the earpieces 100 connected to the headband 102. Another alternate variant may replace the headband 102 with a different band structured to be worn around the back of the head and/or the back of the neck of a user.

In the physical configuration 1500*a*, each of the earpieces 100 may be either an "on-ear" or an "over-the-ear" form of earcup, depending on their size relative to the pinna of a typical human ear. As previously discussed, each earpiece 100 has the casing 110 in which the cavity 112 is formed, and the casing 110 carries the ear coupling 115. In this physical configuration, the ear coupling is in the form of a flexible cushion (possibly ring-shaped) that surrounds the periphery of the opening into the cavity 112 and that has the passage 117 formed therethrough that communicates with the cavity 112.

Where the earpieces 100 are structured to be worn as over-the-ear earcups, the casing 110 and the ear coupling 115 cooperate to substantially surround the pinna of an ear of a user. Thus, when such a variant of the personal acoustic device 1000*a* is correctly positioned, the headband 102 and the casing 110 cooperate to press the ear coupling 115 against portions of a side of the user's head surrounding the pinna of an ear such that the pinna is substantially hidden from view. Where the earpieces 100 are structured to be worn as on-ear earcups, the casing 110 and ear coupling 115 cooperate to overlie peripheral portions of a pinna that surround the entrance of an associated ear canal. Thus, when correctly positioned, the headband 102 and the casing 110 cooperate to press the ear coupling 115 against peripheral portions of the pinna in a manner that likely leaves portions of the periphery of the pinna visible. The pressing of the flexible material of the ear coupling 115 against either peripheral portions of a pinna or portions of a head surrounding a pinna serves both to acoustically couple the ear canal with the cavity 112 through the passage 117, and to form the previously discussed acoustic seal to enable the provision of PNR.

Figure 2B:
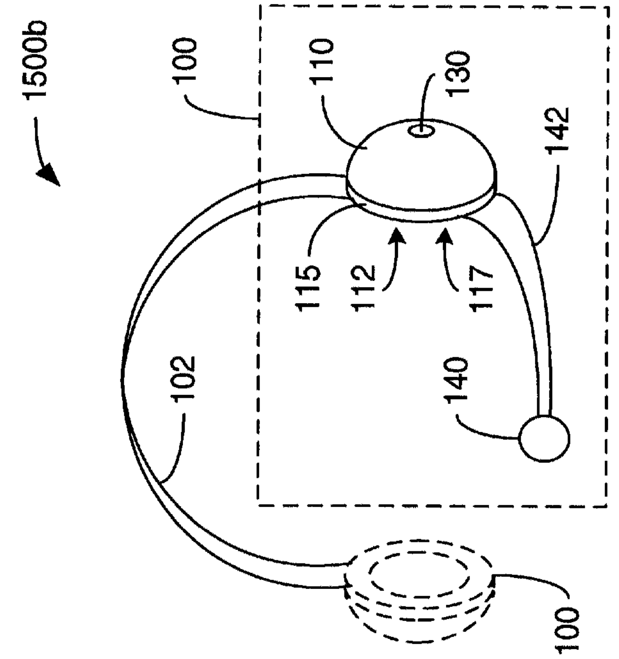

FIG. 2*b* depicts another over-the-head physical configuration 1500*b* that is substantially similar to the physical configuration 1500*a*, but in which one of the earpieces 100 additionally incorporates a communications microphone 140 connected to the casing 110 via a microphone boom 142. When this particular one of the earpieces 100 is correctly positioned in the vicinity of a user's ear, the microphone boom 142 extends generally alongside a portion of a cheek of the user to position the communications microphone 140 closer to the mouth of the user to detect speech sounds acoustically output from the user's mouth. However, and although not specifically depicted, an alternative variant of the physical configuration 1500*b* is possible in which the communications microphone 140 is more directly disposed on the casing 110, and the microphone boom 142 is a hollow tube that opens on one end in the vicinity of the user's mouth and on the other end in the vicinity of the communications microphone 140 to convey sounds through the tube from the vicinity of the user's mouth to the communications microphone 140.

FIG. 2*b* also depicts the other of the earpieces 100 with broken lines to make clear that still another variant of the physical configuration 1500*b* is possible that incorporates only the one of the earpieces 100 that incorporates the communications microphone 140. In such another variant, the headband 102 would still be present and would continue to be worn over the head of the user.

As previously discussed, the control circuit 2000 and/or other electronic components may be at least partly disposed either within a casing 110 of an earpiece 100, or may be at least partly disposed in another casing (not shown). With regard to the physical configurations 1500*a* and 1500*b* of FIGS. 1*a* and 1*b*, respectively, such another casing may incorporated into the headband 102 or into a different form of band connected to at least one earpiece 100. Further, although each of the physical configurations 1500*a* and 1500*b* depict the provision of individual ones of the outer microphone 130 disposed on each casing 110 of each earpiece 100, alternate variants of these physical configurations are possible in which a single outer microphone 130 is disposed elsewhere, including and not limited to, on the headband 102 or on the boom 142. In such variants having two of the earpieces 100, the signal output by a single such outer microphone 130 may be separately compared to each of the signals output by separate ones of the inner microphones 120 that are separately disposed within the separate cavities 112 of each of the two earpieces 100.

Figure 2D:
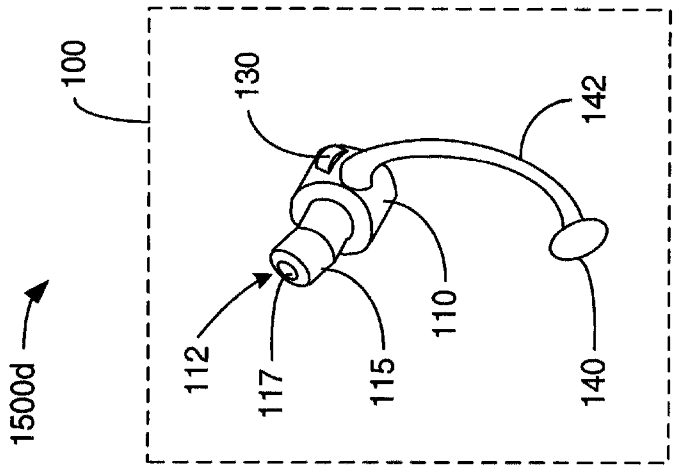
Figure 2C:
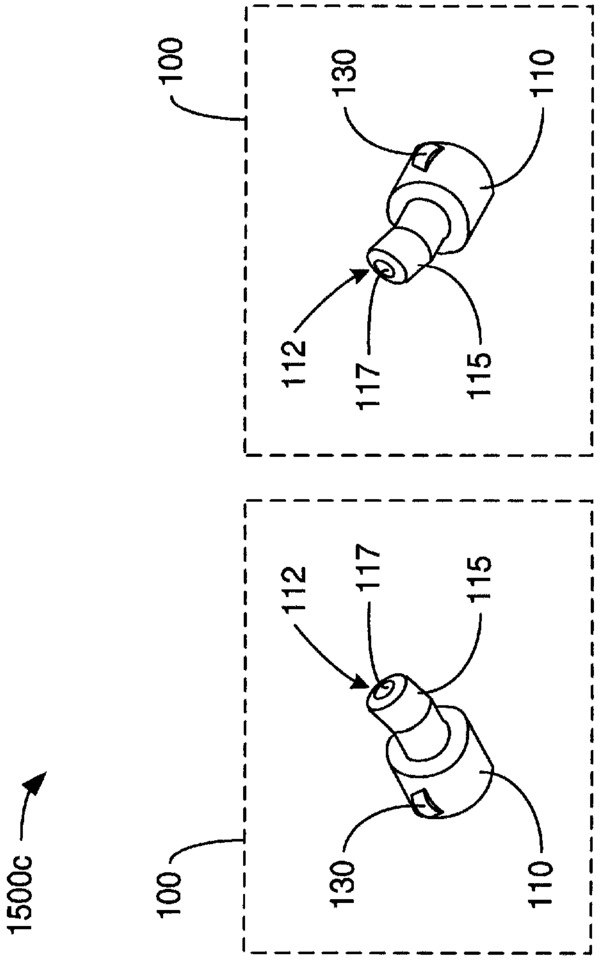

FIG. 2*c* depicts an "in-ear" physical configuration 1500*c* that incorporates a pair of earpieces 100 that are each in the form of an in-ear earphone, and that may or may not be connected by a cord and/or by electrically or optically conductive cabling (not shown). However, and although not specifically depicted, an alternate variant of the physical configuration 1500*c* may incorporate only one of the earpieces 100.

As previously discussed, each of the earpieces 100 has the casing 110 in which the open cavity 112 is formed, and that carries the ear coupling 115. In this physical configuration, the ear coupling 115 is in the form of a substantially hollow tube-like shape defining the passage 117 that communicates with the cavity 112. In some implementations, the ear coupling 115 is formed of a material distinct from the casing 110 (possibly a material that is more flexible than that from which the casing 110 is formed), and in other implementations, the ear coupling 115 is formed integrally with the casing 110.

Portions of the casing 110 and/or of the ear coupling 115 cooperate to engage portions of the concha and/or the ear canal of a user's ear to enable the casing 110 to rest in the vicinity of the entrance of the ear canal in an orientation that acoustically couples the cavity 112 with the ear canal through the passage 117. Thus, when the earpiece 100 is properly positioned, the entrance to the ear canal is substantially "plugged" to create the previously discussed acoustic seal to enable the provision of PNR.

FIG. 2*d* depicts another in-ear physical configuration 1500*d* that is substantially similar to the physical configuration 1500*c*, but in which one of the earpieces 100 is in the form of a single-ear headset (sometimes also called an "earset") that additionally incorporates a communications microphone 140 disposed on the casing 110. When this earpiece 100 is correctly positioned in the vicinity of a user's ear, the communications microphone 140 is generally oriented towards the vicinity of the mouth of the user in a manner chosen to detect speech sounds produced by the user. However, and although not specifically depicted, an alternative variant of the physical configuration 1500*d* is possible in which sounds from the vicinity of the user's mouth are conveyed to the communications microphone 140 through a tube (not shown), or in which the communications microphone 140 is disposed on a microphone boom 142 connected to the casing 110 and positioning the communications microphone 140 in the vicinity of the user's mouth.

Although not specifically depicted in FIG. 2*d*, the depicted earpiece 100 of the physical configuration 1500*d* having the communications microphone 140 may or may not be accompanied by another earpiece having the form of an in-ear earphone (such as one of the earpieces 100 depicted in FIG. 2*c*) that may or may not be connected to the earpiece 100 depicted in FIG. 2*d* via a cord or conductive cabling (also not shown).

Referring again to both of the physical configurations 1500*b* and 1500*d*, as previously discussed, implementations of the personal acoustic device 1000*b* supporting two-way communications are possible in which the communications microphone 140 and the outer microphone 130 are one and the same microphone. To enable two-way communications, this single microphone is preferably positioned at the end of the boom 142 or otherwise disposed on a casing 110 in a manner enabling detection of a user's speech sounds. Further, in variants of such implementations having a pair of the earpieces 100, the single microphone may serve the functions of all three of the communications microphone 140 and both of the outer microphones 130.

FIGS. 3*a* through 3*f* depict possible electrical architectures that may be employed by the control circuit 2000 in implementations of either of the personal acoustic devices 1000*a* and 1000*b*. As in the case of FIGS. 1*a-b*, although possible implementations of the personal acoustic devices 1000*a* and 1000*b* may have either a single earpiece 100 or a pair of the earpieces 100, electrical architectures associated with only one earpiece 100 are depicted and described in relation to each of FIGS. 3*a-f* for the sake of simplicity and ease of understanding. In implementations having a pair of the earpieces 100, at least a portion of any of the electrical architectures discussed in relation to any of FIGS. 3*a-f* and/or portions of their components may be duplicated between the two earpieces 100 such that the control circuit 2000 is able to receive and analyze signals from the inner microphones 120 and the outer microphones 130 of two earpieces 100. Further, these electrical architectures are presented in somewhat simplified form in which minor components (e.g., microphone preamplifiers, audio amplifiers, analog-to-digital converters, digital-to-analog converters, etc.) are intentionally not depicted for the sake of clarity and ease of understanding.

As previously discussed with regard to FIGS. 1*a-b*, the placement of the inner microphone 120 within the cavity 112 of an earpiece 100 of either of the personal acoustic devices 1000*a* or 1000*b* enables detection of how environmental sounds external to the casing 110 (represented by the sounds emanating from the acoustic noise source 9900) are subjected to at least some degree of attenuation before being detected by the inner microphone 120. Also, this attenuation may be at least partly a result of ANR functionality being provided. Further, the degree of this attenuation changes depending on whether the earpiece 100 is positioned in the vicinity of an ear, or not. To put this another way, a sound propagating from the acoustic noise source 9900 to the location of the inner microphone 120 within the cavity 112 is subjected to different transfer functions that each impose a different degree of attenuation depending on whether the earpiece 100 is positioned in the vicinity of an ear, or not.

As also previously discussed, the outer microphone 130 is carried by the casing 110 of the earpiece 100 in a manner that remains acoustically coupled to the environment external to the casing 110 regardless of whether the earpiece 100 is in the operating state of being positioned in the vicinity of an ear, or not. To put this another way, a sound propagating from the acoustic noise source 9900 to the outer microphone 130 is subjected to a relatively stable transfer function that attenuates the sound in a manner that is relatively stable, even as the transfer functions to which the same sound is subjected as it propagates from the acoustic noise source 9900 to the inner microphone 120 change with a change in operating state of the earpiece 100.

In each of these electrical architectures, the control circuit 2000 employs the signals output by the inner microphone 120 and the outer microphone 130 in analyses to determine whether an earpiece 100 is in the operating state of being positioned in the vicinity of an ear, or not. The signal output by the outer microphone 130 is used as a reference against which the signal output by the inner microphone 120 is compared, and differences between these signals caused by differences in the transfer functions to which a sound is subjected in reaching each of the outer microphone 130 and the inner microphone 120 are analyzed to determine if those differences are consistent with the earpiece being so positioned, or not.

However, and as will be explained in greater detail, the signals output by one or both of the inner microphone 120 and/or the outer microphone 130 may also be employed for other purposes, including and not limited to various forms of feedback-based and feedforward-based ANR. Further, in at least some of these electrical architectures, the control circuit 2000 may employ various techniques to compensate for the effects of PNR and/or ANR on the detection of sound by the inner microphone 120.

Figure 3A:
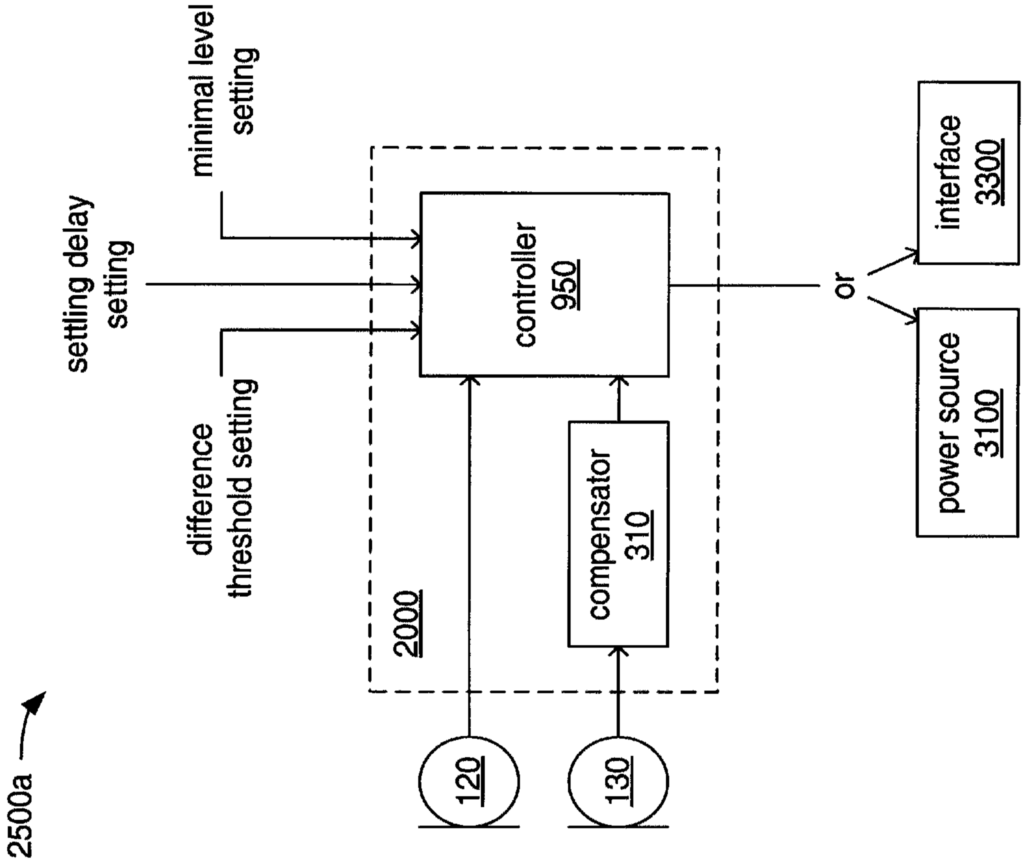
FIGS. 3*a* through 3*f* depict portions of possible electrical architectures of personal acoustic devices in which comparisons are made between signals provided by an inner microphone and an outer microphone.

FIG. 3*a* depicts a possible electrical architecture 2500*a* of the control circuit 2000 usable in either of the personal acoustic devices 1000*a* and 1000*b* where at least PNR is provided. In employing the electrical architecture 2500*a*, the control circuit 2000 incorporates a compensator 310 and a controller 950, which are interconnected to analyze a difference in signal levels of the signals received from the inner microphone 120 and the outer microphone 130.

The inner microphone 120 detects the possibly more attenuated form of a sound emanating from the acoustic noise source 9900 present within the cavity 112, and outputs a signal representative of this sound to the controller 950. The outer microphone 130 detects the same sound emanating from the acoustic noise source 9900 at a location external to the cavity 112, and outputs a signal representative this sound to the compensator 310. The compensator 310 subjects the signal from the outer microphone 130 to a transfer function selected to alter the sound represented by the signal in a manner substantially similar to the transfer function to which the sound emanating from the acoustic noise source 9900 is subjected as it reaches the inner microphone 120 at a time when the earpiece 100 is positioned in the vicinity of an ear. The compensator 310 then provides the resulting altered signal to the controller 950, and the controller 950 analyzes signal level differences between the signals received from the inner microphone 120 and the compensator 310. In analyzing the received signals, the controller 950 may be provided with one or more of a difference threshold setting, a settling delay setting and a minimum level setting.

In analyzing the signal levels of the two received signals, the controller 950 may employ bandpass filters or other types of filters to limit the analysis of signal levels to a selected range of audible frequencies. As those skilled in the art will readily recognize, the choice of a range of frequencies (or of multiple ranges of frequencies) must be at least partly based on the range(s) of frequencies in which environmental noise sounds are expected to occur and/or range(s) of frequencies in which changes in attenuation of sounds entering the cavity 112 as a result of changes in operating state are more easily detected, given various acoustic characteristics of the cavity 112, the passage 117 and/or the acoustic seal that is able to be formed. By way of example, the range of frequencies may be selected to be approximately 100 Hz to 500 Hz in recognition of findings that many common environmental noise sounds have acoustic energy within this frequency range. By way of another example, the range of frequencies may be selected to be approximately 400 Hz to 600 Hz in recognition of findings that changes in PNR provided by at least some variants of over-the-ear physical configurations as a result of changes in operating state are most easily detected in such a range of frequencies. However, as those skilled in the art will readily recognize, other ranges of frequencies may be selected, multiple discontiguous ranges of frequencies may be selected, and any selection of a range of frequencies may be for any of a variety of reasons.

Subjecting the signal output by the outer microphone 130 to being altered by the transfer function of the compensator 310 enables the controller 950 to determine that the earpiece 100 is in the operating state of being positioned in the vicinity of an ear when it detects that the signal levels of the signals received from the inner microphone 120 and the compensator within the selected range(s) of frequencies are similar to the degree specified by the difference threshold setting. Otherwise, the earpiece 100 is determined to not be in the operating state of being so positioned. In an alternative implementation, the compensator 310 subjects the signal from the outer microphone 130 to a transfer function selected to alter the sound represented by the signal in a manner substantially similar to the transfer function to which the sound emanating from the acoustic noise source 9900 is subjected as it reaches the inner microphone 120 at a time when the earpiece 100 is in the operating state of not positioned in the vicinity of an ear. In such an alternative implementation, the controller 950 determines that the earpiece 100 is not positioned in the vicinity of an ear when it detects that the signal levels of the signals received from the inner microphone 120 and the compensator 310 within the selected range(s) of frequencies are similar to the degree specified by the difference threshold setting. Otherwise, the earpiece 100 is determined to be in the operating state of being positioned in the vicinity of an ear.

In still other alternative implementations, the signal output by the outer microphone 130 may be provided to the controller 950 without being subjected to a transfer function, and instead, an alternate compensator may be interposed between the inner microphone 120 and the controller 950. Such an alternate compensator would subject the signal output by the inner microphone 120 to a transfer function selected to alter the sound represented by the signal in a manner that substantially reverses the transfer function to which the sound emanating from the acoustic noise source 9900 is subjected as it reaches the inner microphone 120, either at a time when the earpiece 100 is in the operating state of being positioned in the vicinity of an ear, or at a time when the earpiece is not in the operating state of being so positioned. The controller 950 then determines whether the earpiece 100 is so positioned, or not, based on detecting whether or not the signal levels within the selected range(s) of frequencies are similar to the degree specified by the difference threshold setting.

However, in yet another alternative implementation, the signals output by each of the inner microphone 120 and the outer microphone 130 are provided to the controller 950 without such alteration by compensators. In such an implementation, one or more difference threshold settings may specify two different degrees of difference in signal levels, where one is consistent with the earpiece 100 being in the operating state of being positioned in the vicinity of an ear, and the other is consistent with the earpiece 100 being in the operating state of not being so positioned. The controller then detects whether the difference in signal level between the two received signals within the selected range(s) of frequencies is closer to one of the specified degrees of difference, or the other, to determine whether or not the earpiece is positioned in the vicinity of an ear. In determining the degree of similarity of signal levels between signals, the controller 950 may employ any of a variety of comparison algorithms. In some implementations, the difference threshold setting(s) provided to the controller 950 may indicate the degree of difference in terms of a percentage or an amount in decibels.

As previously discussed, determining the current operating state of an earpiece 100 and/or of the entirety of the personal acoustic device 1000*a* or 1000*b* is a necessary step to determining whether or not a change in the operating state has occurred. To put this another way, the controller 2000 determines that a change in operating state has occurred by first determining that an earpiece 100 and/or the entirety of the personal acoustic device 1000*a* or 1000*b* was earlier in one operating state, and then determining that the same earpiece 100 and/or the entirety of the personal acoustic device 1000*a* or 1000*b* is currently in another operating state.

In response to determining that the earpiece 100 and/or the entirety of the personal acoustic device 1000*a* or 1000*b* is currently in a particular operating state, and/or in response to determining that a change in state of an earpiece 100 and/or of the entirety of the personal acoustic device 1000*a* or 1000*b* has occurred, it is the controller 950 of the control circuit 2000 that takes action, such as signaling the power source 3100, the ANR circuit 3200, the interface 3300, the audio controller 3400, and/or other components, as previously described. However, as will be understood by those skilled in the art, spurious movements or other acts of a user that generate spurious sounds and/or momentarily move an earpiece 100 relative to an ear may be detected by one or both of the inner microphone 120 and the outer microphone 130, and may result in false determinations of a change in operating state of an earpiece 100. This may result in false determinations that a change in operating state of the entirety of the personal acoustic device 1000*a* or 1000*b* has occurred, and/or the controller 950 taking unnecessary actions. To counter such results, the controller 950 may be supplied with a delay setting specifying a selected period of time that the controller 950 allows to pass since the last instance of determining that a change in operating state of an earpiece 100 has occurred before making a determination of whether a change in operating state of the entirety of the personal acoustic device 1000*a* or 1000*b* has occurred, and/or before taking any action in response.

In some implementations, the controller 950 may also be supplied a minimum level setting specifying a selected minimum signal level that must be met by one or both of the signals received from the inner microphone 120 and the outer microphone 130 (whether through a compensator of some variety, or not) for those signals to be deemed reliable for use in determining whether an earpiece 100 is positioned in the vicinity of an ear, or not. This may be done in recognition of the reliance of the analysis performed by the controller 950 on there being environmental noise sounds available to be detected by the inner microphone 120 and the outer microphone 130. In response to occasions when there are insufficient environmental noise sounds available for detection by the inner microphone 120 and/or the outer microphone 130, and/or for the generation of signals by the inner microphone 120 and the outer microphone 130, the controller 950 may simply refrain from attempting to determine a current operating state, refrain from determining whether a change in operating state of an earpiece 100 and/or of the personal acoustic device 1000*a* or 1000*b* has occurred, and/or refrain from taking any actions, at least until usable environmental noise sounds are once again available. Alternatively and/or additionally, the controller 950 may temporarily alter the range of frequencies on which analysis of signal levels is based in an effort to locate an environmental noise sound outside the range of frequencies otherwise normally used in analyzing the signals output by the inner microphone 120 and the outer microphone 130.

Figure 3B:
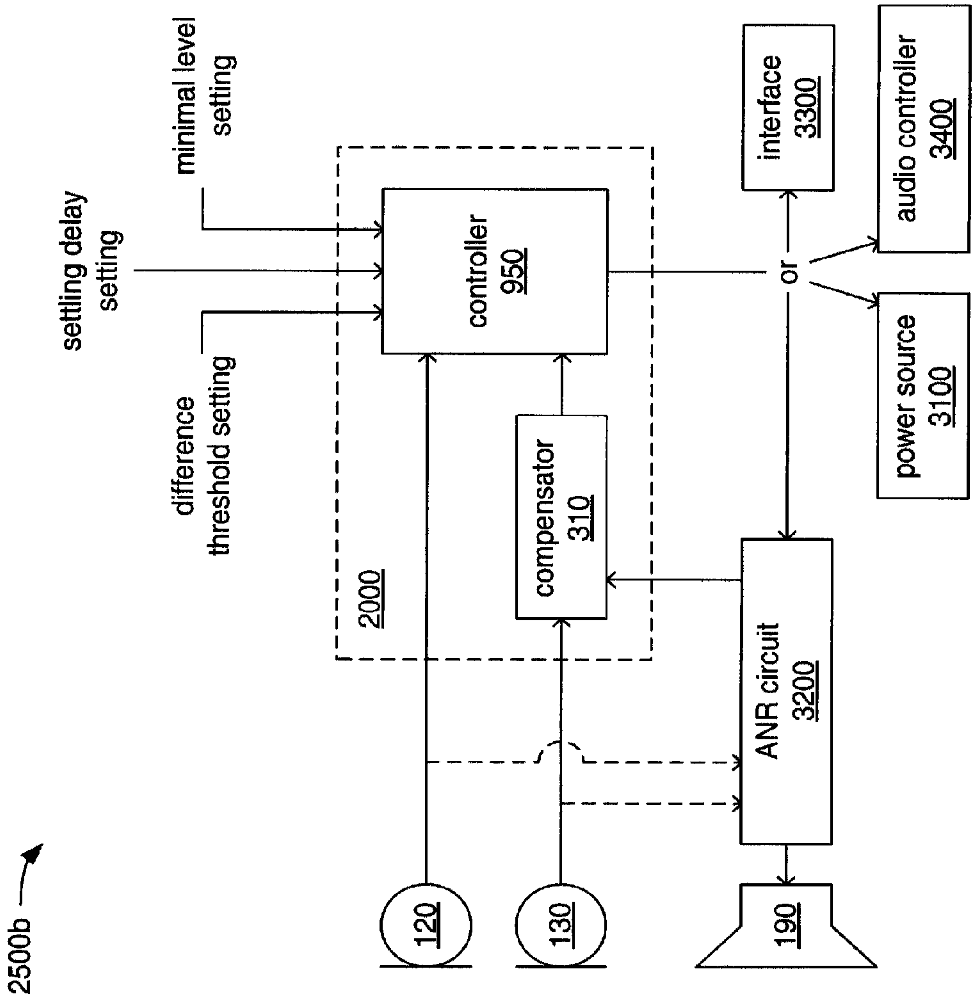

FIG. 3*b* depicts a possible electrical architecture 2500*b* of the control circuit 2000 usable in the personal acoustic device 1000*b* where at least ANR entailing the acoustic output of anti-noise sounds by the acoustic driver 190 is provided. The electrical architecture 2500*b* is substantially similar to the electrical architecture 2500*a*, but the electrical architecture 2500*b* additionally supports adjusting one or more characteristics of the transfer function imposed by the compensator 310 in response to input received from the ANR circuit 3200. Depending on the type of ANR provided, one or both of the inner microphone 120 and the outer microphone 130 may also output signals representing the sounds that they detect to the ANR circuit 3200.

In some implementations, the ANR circuit 3200 may provide an adaptive form of feedback-based and/or feedforward-based ANR in which filter coefficients, gain settings and/or other parameters may be dynamically adjusted as a result of whatever adaptive ANR algorithm is employed. As those skilled in the art will readily recognize, changes made to such ANR parameters will necessarily result in changes to the transfer function to which sounds reaching the inner microphone 120 are subjected. The ANR circuit 3200 provides indications of the changing parameters to the compensator 310 to enable the compensator 310 to adjust its transfer function to take into account the changing transfer function to which sounds reaching the inner microphone 120 are subjected.

In other implementations, the ANR circuit 3200 may be capable of being turned on or off, and the ANR circuit 3200 may provide indications of being on or off to the compensator 310 to enable the compensator to alter the transfer function it imposes in response. However, in such other implementations where the controller 950 signals the ANR circuit 3200 to turn on or off, it may be the controller 950, rather than the ANR circuit 3200, that provides an indication to the compensator 310 of the ANR circuit 3200 being turned on or off.

Alternatively, in implementations where an alternate compensator is interposed between the inner microphone 120 and the controller 950, the ANR circuit 3200 may provide inputs to the alternate compensator to enable it to adjust the transfer function it employs to reverse the attenuating effects of the transfer function to which sounds reaching the inner microphone 120 are subjected. Or, the alternate compensator may receive signals indicating that the ANR circuit 3200 has been turned on or off.

Figure 3C:
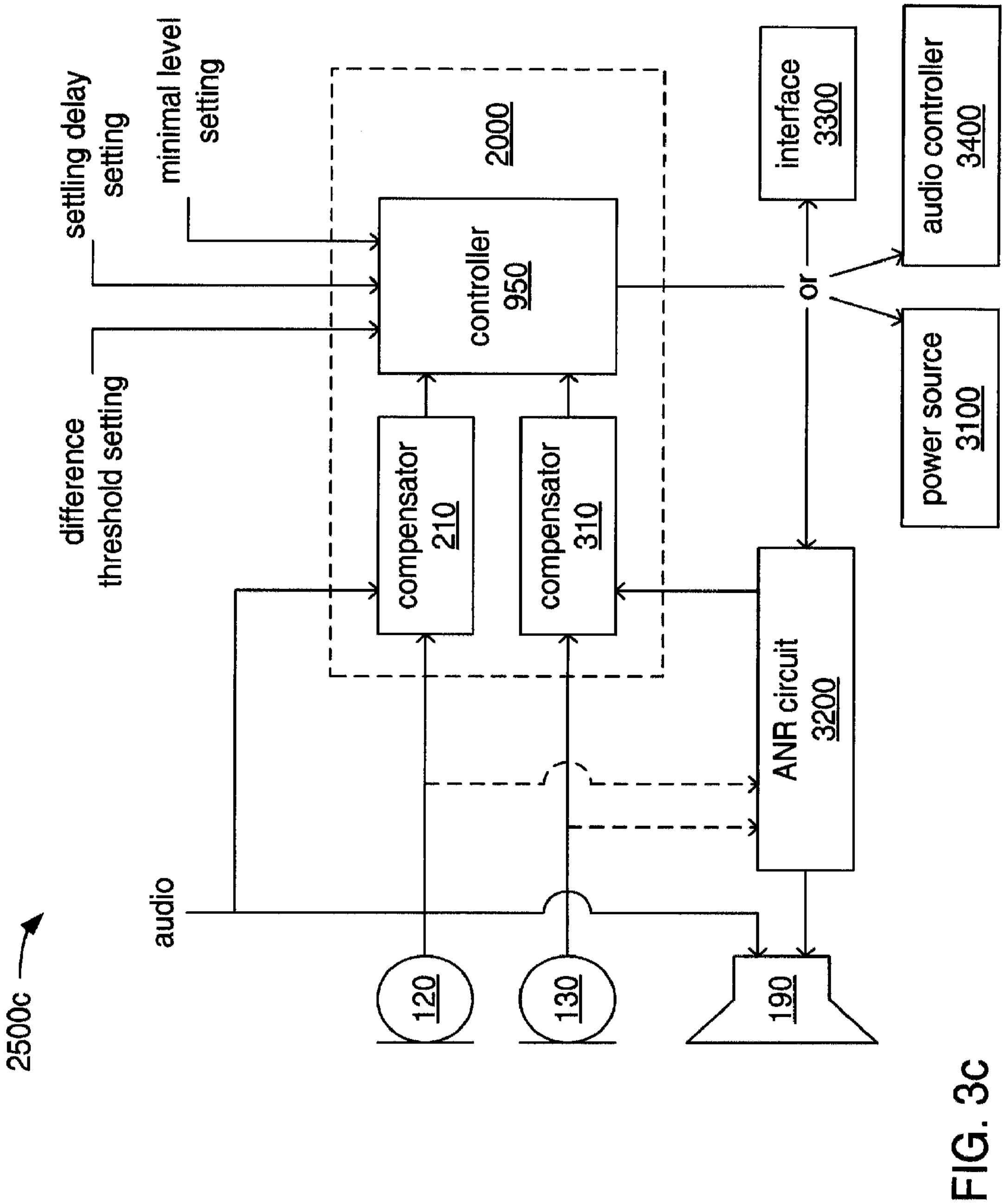

FIG. 3*c* depicts a possible electrical architecture 2500*c* of the control circuit 2000 usable in the personal acoustic device 1000*b* where at least acoustic output of electronically provided audio by the acoustic driver 190 is provided in addition to the provision of ANR. The electrical architecture 2500*c* is substantially similar to the electrical architecture 2500*b*, but the electrical architecture 2500*c* additionally supports the acoustic output of electronically provided audio (e.g., audio signal from an external or built-in CD player, radio or MP3 player) through the acoustic driver 190. Those skilled in the art will readily recognize that the combining of ANR anti-noise sounds and electronically provided audio to enable the acoustic driver 190 to acoustically output both may be accomplished in any of a variety of ways. In employing the electrical architecture 2500*c*, the control circuit 2000 additionally incorporates another compensator 210, along with the compensator 310 and the controller 950.

The inner microphone 120 detects the possibly more attenuated form of a sound emanating from the acoustic noise source 9900 located within the cavity 112 (along with other sounds that may be present within the cavity 112) and outputs a signal representative of this sound to the compensator 210. The compensator 210 also receives a signal representing the electronically provided audio that is acoustically output by the acoustic driver 190, and at least partially subtracts the electronically provided audio from the sounds detected by the inner microphone 120. The compensator 210 may subject the signal representing the electronically provided audio to a transfer function selected to alter the electronically provided audio in a manner substantially similar to the transfer function that the acoustic output of the electronically provided audio is subjected to in propagating from the acoustic driver 190 to the inner microphone 120 as a result of the acoustics of the cavity 112 and/or the passage 117. The compensator 210 then provides the resulting altered signal to the controller 950, and the controller 950 analyzes signal level differences between the signals received from the compensators 210 and 310.

Figure 3D:
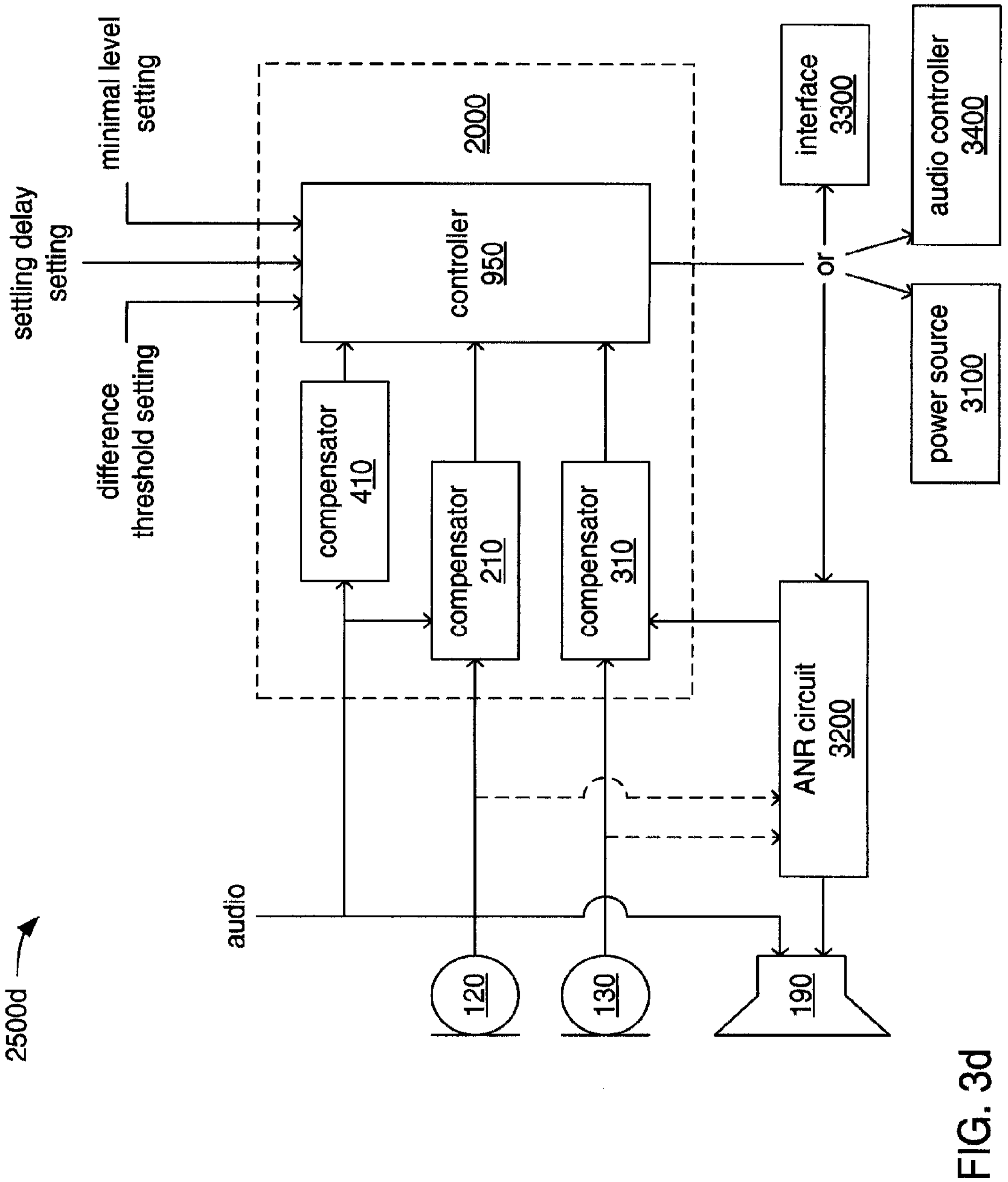

FIG. 3*d* depicts a possible electrical architecture 2500*d* of the control circuit 2000 that is also usable in the personal acoustic device 1000*b* where at least acoustic output of electronically provided audio by the acoustic driver 190 is provided in addition to the provision of ANR. The electrical architecture 2500*d* is substantially similar to the electrical architecture 2500*c*, but the electrical architecture 2500*d* additionally supports the use of a comparison of the signal level of the signal output by the inner microphone 120 to the signal level of a modified form of electronically provided audio, at least at times when there are insufficient environmental noise sounds available with sufficient strength to enable a reliable analysis of differences between the signals output by the inner microphone 120 and the outer microphone 130. In employing the electrical architecture 2500*d*, the control circuit 2000 additionally incorporates still another compensator 410, along with the compensators 210 and 310, and along with the controller 950.

The controller 950 monitors the signal level of at least the output of the outer microphone 130, and if that signal levels drops below the minimal level setting, the controller 950 refrains from analyzing differences between the signals output by the inner microphone 120 and the outer microphone 130. On such occasions, if electronically provided audio is being acoustically output by the acoustic driver 190 into the cavity 112, then the controller 950 operates the compensator 210 to cause the compensator 210 to cease modifying the signal received from the inner microphone 120 in any way such that the signal output by the inner microphone 120 is provided by the compensator 210 to the controller 950 unmodified. The compensator 410 receives the signal representing the electronically provided audio that is acoustically output by the acoustic driver 190, and subjects the signal representing the electronically provided audio to a transfer function selected to alter the electronically provided audio in a manner substantially similar to the transfer function that the acoustic output of the electronically provided audio is subjected to in propagating from the acoustic driver 190 to the inner microphone 120 as a result of the acoustics of the cavity 112 and/or the passage 117. The compensator 210 then provides the resulting altered signal to the controller 950, and the controller 950 analyzes signal level differences between the signals received from the inner microphone 120 (unmodified by the compensator 210) and the compensator 410.

As those skilled in the art will readily recognize, the strength of any audio acoustically output by the acoustic driver 190 into the cavity 112 as detected by the inner microphone 120 differs between occasions when the cavity 112 and the passage 117 are acoustically coupled to the environment external to the casing 110 and occasions when they are acoustically coupled to an ear canal. In a manner not unlike the analysis of signal levels between the signals output by the inner microphone 120 and the outer microphone 130, an analysis of differences between signals levels of the signals output by the inner microphone 120 and the compensator 410 may be used to determine the current operating state of the earpiece and/or the entirety of the personal acoustic device 1000*b*.

Figure 3E:
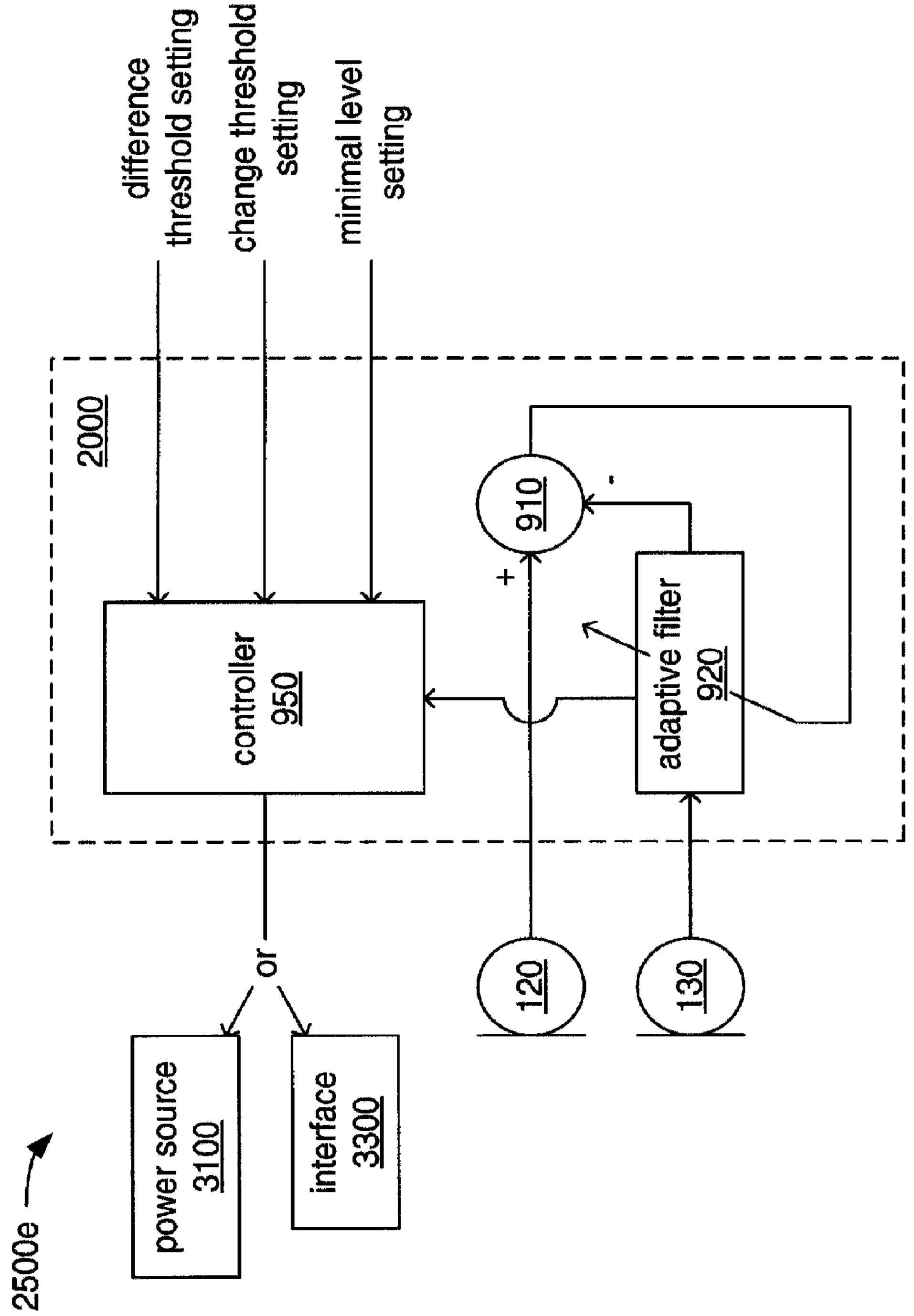

FIG. 3*e* depicts a possible electrical architecture 2500*e* of the control circuit 2000 usable in either of the personal acoustic devices 1000*a* and 1000*b* where at least PNR is provided. In employing the electrical architecture 2500*e*, the control circuit 2000 incorporates a subtractive summing node 910, an adaptive filter 920 and a controller 950, which are interconnected to analyze signals received from the inner microphone 120 and the outer microphone 130 to derive a transfer function indicative of a difference between them.

The inner microphone 120 detects the possibly more attenuated form of a sound emanating from the acoustic noise source 9900 present in the cavity 112 and outputs a signal representative of this sound to the subtractive summing node 910. The outer microphone 130 detects the same sound emanating from the acoustic noise source 9900 at a location external to the cavity 112, and outputs a signal representative of this sound to the adaptive filter 920. The adaptive filter 920 outputs a filtered form of the signal output by the outer microphone 130 to the subtractive summing node 910, where it is subtracted from the signal output by the inner microphone 120. The signal that results from this subtraction is then provided back to the adaptive filter 920 as an error term input. This interconnection between the subtractive summing node 910 and the adaptive filter 920 enables the subtractive summing node 910 and the adaptive filter 920 to cooperate to iteratively derive a transfer function by which the signal output by the outer microphone 130 is altered before being subtracted from the signal output by the inner microphone 120 to iteratively reduce the result of the subtraction to as close to zero as possible. The adaptive filter 920 provides data characterizing the derived transfer function on a recurring basis to the controller 950. In analyzing the received signals, the controller 950 may be provided with one or more of a difference threshold setting, a change threshold setting and a minimum level setting.

As previously discussed, a sound emanating from the acoustic noise source 9900 is subjected to different transfer functions as it propagates to each of the inner microphone 120 and the outer microphone 130. The propagation of that sound from the acoustic noise source 9900 to the inner microphone 120 together with the effects of its conversion into an electrical signal by the inner microphone 120 can be represented as a first transfer function $H_1(s)$. Analogously, the propagation of the same sound from the acoustic noise source 9900 to the outer microphone 130 together with the effects of its conversion into an electrical signal by the outer microphone 130 can be represented as a second transfer function $H_2(s)$. The transfer function derived by the cooperation between the subtractive summing node 910 and the adaptive filter 920 can be represented by a third transfer function $H_3(s)$. As the error term approaches zero, the $H_3(s)$ approximates $H_1(s)/H_2(s)$. Therefore, as the error term approaches zero, the derived transfer function $H_3(s)$ is at least indicative of the difference in the transfer functions to which a sound propagating from the acoustic noise source 9900 to each of the inner microphone 120 and the outer microphone 130 is subjected.

In implementations where the inner microphone 120 and the outer microphone 130 have substantially similar characteristics in converting the sounds they detect into electrical signals, the difference in the portions of each of the transfer functions $H_1(s)$ and $H_2(s)$ that are attributable to conversions of detected sounds to electrical signals are comparatively negligible, and effectively cancel each other in the derivation of the transfer function $H_3(s)$. Therefore, where the conversion characteristics of the inner microphone 120 and the outer microphone 130 are substantially similar, the derived transfer function $H_3(s)$ becomes equal to the difference in the transfer functions to which the sound propagating from the acoustic noise source 9900 to each of the inner microphone 120 and the outer microphone 130 is subjected as the error term approaches zero.

As also previously discussed, the transfer function to which a sound propagating from the acoustic noise source 9900 to the inner microphone 120 is subjected changes as the earpiece 100 changes operating states between being positioned in the vicinity of an ear and not being so positioned. Therefore, as the error term approaches zero, changes in the derived transfer function $H_3(s)$ become at least indicative of the changes in the transfer function to which the sound propagating from the acoustic noise source 9900 to the inner microphone 120 is subjected. And further, where the conversion characteristics of the inner microphone 120 and the outer microphone 130 are substantially similar, changes in the derived transfer function $H_3(s)$ become equal to the changes in the transfer function to which the sound propagating from the acoustic noise source 9900 to the inner microphone 120 is subjected.

In some implementations, the controller 950 compares the data received from the adaptive filter 920 characterizing the derived transfer function to stored data characterizing a transfer function consistent with the earpiece 100 being in either one or the other of the operating state of being positioned in the vicinity of an ear and the operating state of not being so positioned. In such implementations, the controller 950 is supplied with a difference threshold setting specifying the minimum degree to which the data received from the adaptive filter 920 must be similar to the stored data for the controller 950 to detect that the earpiece 100 is in that operating state. In other implementations, the controller 950 compares the data characterizing the derived transfer function both to stored data characterizing a transfer function consistent with the earpiece 100 being positioned in the vicinity of an ear and to other stored data characterizing a transfer function consistent with the earpiece 100 not being so positioned. In such other implementations, the controller 950 may determine the degree of similarity that the data characterizing the derived transfer function has to stored data characterizing each of the transfer functions consistent with each of the possible operating states of the earpiece.

In determining the degree of similarity between pieces of data characterizing transfer functions, the controller 950 may employ any of a variety of comparison algorithms, the choice of which may be determined by the nature of the data received from the adaptive filter 920 and/or characteristics of the type of filter employed as the adaptive filter 920. By way of example, in implementations in which the adaptive filter 920 is a finite impulse response (FIR) filter, the data received from the adaptive filter 920 may characterize the derived transfer function in terms of filter coefficients specifying the impulse response of the derived transfer function in the time domain. In such implementations, a discrete Fourier transform (DFT) may be employed to convert these coefficients into the frequency domain to enable a comparison of sets of mean squared error (MSE) values. Further, in implementations in which the adaptive filter 920 is a FIR filter, a FIR filter with a relatively small quantity of taps may be used and a relatively small number of coefficients may make up the data characterizing its derived transfer function. This may be deemed desirable to conserve power and/or to allow possibly limited computational resources of the controller 2000 to be devoted to other functions.

Due to the adaptive filter 920 employing an iterative process to derive a transfer function, whenever a change in operating state of the earpiece 100 or another event altering the transfer function to which a sound propagating from the acoustic noise source 9900 to the inner microphone 120 occurs, the adaptive filter 920 requires time to again derive a new transfer function. To put this another way, time is required to allow the adaptive filter 920 to converge to a new solution. As this convergence takes place, the data received from the adaptive filter 920 may include data values that change relatively rapidly and with high magnitudes, especially after a change in operating state of the earpiece 100. Therefore, the controller 950 may be supplied with a change threshold setting selected to cause the controller 950 to refrain from using data received from the adaptive filter 920 to detect whether or not the earpiece 100 is in the vicinity of an ear until the rate of change of the data received from the adaptive filter 920 drops below a degree specified by the change threshold setting such that the data characterizing the derived transfer function is again deemed to be reliable. This provision of a change threshold setting counters instances of false detections of a change in operating state of an earpiece 100 arising from spurious movements or other acts of a user that generate spurious sounds and/or momentarily move an earpiece 100 relative to an ear to an extent detected by one or both of the inner microphone 120 and the outer microphone 130. This aids in preventing false determinations that a change in operating state of the entirety of the personal acoustic device 1000*a* or 1000*b* has occurred, and/or the controller 950 taking unnecessary actions.

In some implementations, the controller 950 may also be supplied a minimum level setting specifying a selected minimum signal level that must be met by one or both of the signals received from the inner microphone 120 and the outer microphone 130 for those signals to be deemed reliable for use in determining whether an earpiece 100 is positioned in the vicinity of an ear, or not. In response to occasions when there are insufficient environmental noise sounds available for detection and/or for the generation of signals by the inner microphone 120 and/or the outer microphone 130, the controller 950 may simply refrain from attempting to determine whether changes in operating state of an earpiece 100 and/or of the personal acoustic device 1000*a* or 1000*b* have occurred, and/or refrain from taking any actions at least until usable environmental noise sounds are once again available.

It should be noted that alternate implementations of the electrical architecture 2500*e* are possible in which the outer microphone 130 provides its output signal to the subtractive summing node 910 and the inner microphone 120 provides output signal to the adaptive filter 920. In such implementations, the derived transfer function would be the inverse of the transfer function that has been described as being derived by cooperation of the subtractive summing node 910 and the adaptive filter 920. However, the manner in which the data provided by the adaptive filter 920 is employed by the controller 950 is substantially the same.

It should also be noted that although no acoustic driver 190 acoustically outputting anti-noise sounds or electronically provided music into the cavity 112 is depicted or discussed in relation to the electrical architecture 2500*e*, this should not be taken to suggest that the acoustic output of such sounds into the cavity 112 would necessarily impede the operation of the electrical architecture 2500*e*. More specifically, a transfer function indicative of the difference in the transfer functions to which a sound propagating from the acoustic noise source 9900 to each of the inner microphone 120 and the outer microphone 130 is subjected would still be derived, and the current operating state of the earpiece 100 and/or of the entirety of the personal acoustic device 1000*a* or 1000*b* would still be determinable.

Figure 3F:
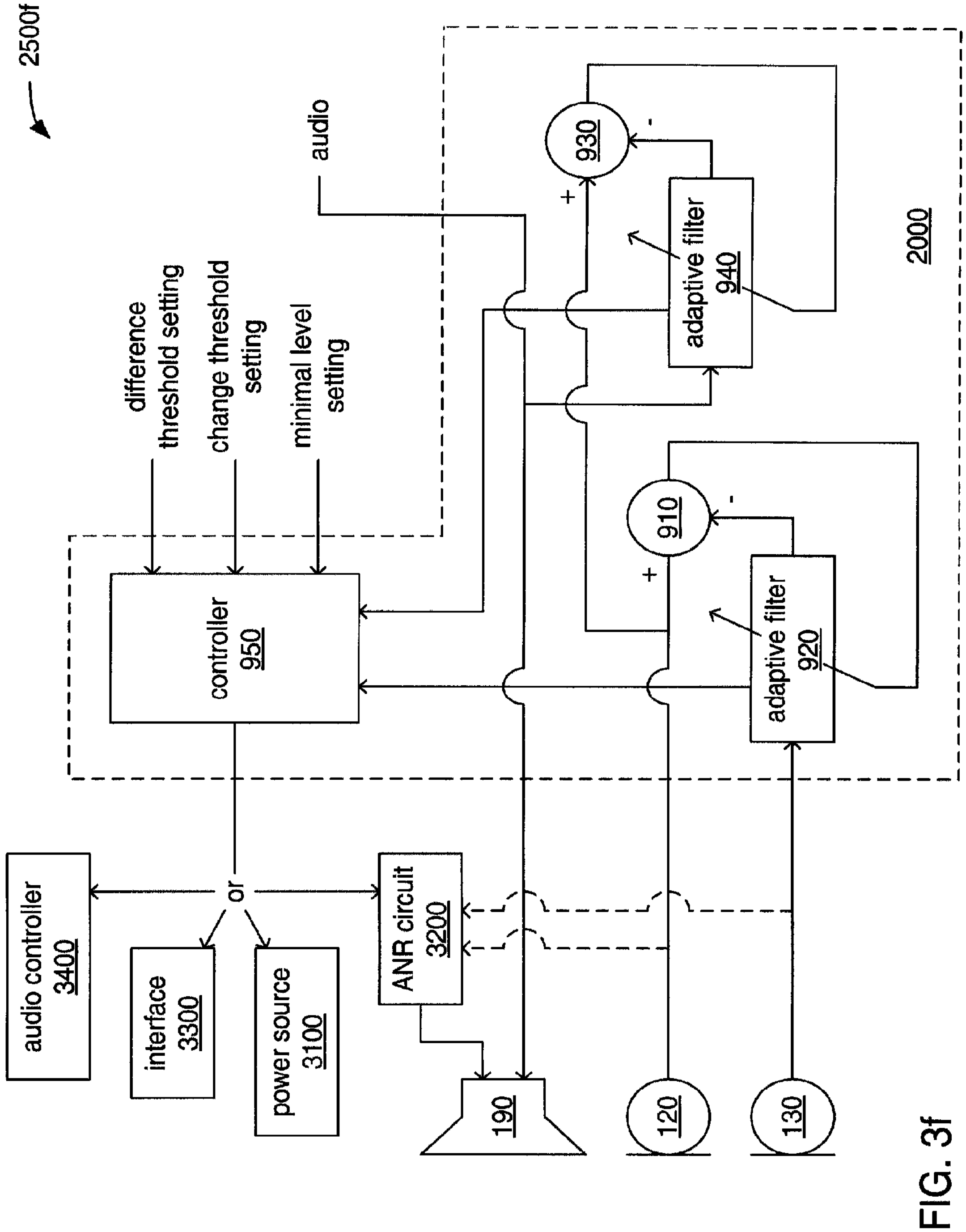

FIG. 3*f* depicts a possible electrical architecture 2500*f* of the control circuit 2000 usable in the personal acoustic device 1000*b* where at least acoustic output of electronically provided audio by the acoustic driver 190 is provided in addition to the provision of ANR. The electrical architecture 2500*f* is substantially similar to the electrical architecture 2500*e*, but the electrical architecture 2500*f* additionally supports the acoustic output of electronically provided audio. In employing the electrical architecture 2500*f*, the control circuit 2000 additionally incorporates an additional subtractive summing node 930 and an additional adaptive filter 940, which are interconnected to analyze signals received from the inner microphone 120 and an audio source.

The signal output by the inner microphone 120 is provided to the subtractive node 930 in addition to being provided to the subtractive node 910. The electronically provided audio signal is provided as an input to the adaptive filter 940, as well as being provided for audio output by the acoustic driver 190. The adaptive filter 940 outputs an altered form of the electronically provided audio signal to the subtractive summing node 930, where it is subtracted from the signal output by the inner microphone 120. The signal that results from this subtraction is then provided back to the adaptive filter 940 as an error term input. In a manner substantially similar to that between the subtractive summing node 910 and the adaptive filter 920, the subtractive summing node 930 and the adaptive filter 940 cooperate to iteratively derive a transfer function by which the electronically provided audio signal is altered before being subtracted from the signal output by the inner microphone 120 to iteratively reduce the result of this subtraction to as close to zero as possible. The adaptive filter 940 provides data characterizing the derived transfer function on a recurring basis to the controller 950. The same difference threshold setting, change threshold delay setting and/or minimum level setting provided to the controller 950 for use in analyzing the data provided by the adaptive filter 920 may also be used by the controller 950 in analyzing the data provided by the adaptive filter 940. Alternatively, as those skilled in the art will readily recognize, it may be deemed desirable to provide the adaptive filter 940 with different ones of these settings.

While the derivation of a transfer function characterized by the data received from the adaptive filter 920 and its analysis by the controller 950 relies on the presence of environmental noise sounds (such as those provided by the acoustic noise source 9900), the derivation of a transfer function characterized by the data received from the adaptive filter 940 and its analysis by the controller 950 relies on the acoustic output of electronically provided sounds by the acoustic driver 190. As will be clear to those skilled in the art, the acoustic characteristics of the cavity 112 and the passage 117 change as they are alternately acoustically coupled to an ear canal and to the environment external to the casing 110 as a result of the earpiece 100 changing operating states between being positioned in the vicinity of an ear and not being so positioned. To put this another way, the transfer function to which sound propagating from the acoustic driver 190 to the inner microphone 120 is subjected changes as the earpiece 100 changes operating state, and in turn, so does the transfer function derived by the cooperation of the subtractive summing node 930 and the adaptive filter 940.

In some implementations, the controller 950 compares the data received from the adaptive filter 940 characterizing the derived transfer function to stored data characterizing a transfer function consistent with the earpiece 100 being in either one or the other of the operating state of being positioned in the vicinity of an ear and the operating state of not being so positioned. In such implementations, the controller 950 is supplied with a difference threshold setting specifying the minimum degree to which the data received from the adaptive filter 940 must be similar to the stored data for the controller 950 to determine that the earpiece 100 is in that operating state. In other implementations, the controller 950 compares the data characterizing this derived transfer function both to stored data characterizing a transfer function consistent with the earpiece 100 being positioned in the vicinity of an ear and to other stored data characterizing a transfer function consistent with the earpiece 100 not being so positioned. In such other implementations, the controller 950 may determine the degree of similarity that the data characterizing the derived transfer function has to stored data characterizing each of the transfer functions consistent with each of the possible operating states of the earpiece 100.

The controller 950 is able to employ the data provided by either or both of the adaptive filters 920 and 940, and one or both may be dynamically selected for use depending on various conditions to increase the accuracy of determinations of occurrences of changes in operating state of the earpiece 100 and/or of the entirety of the personal acoustic device 1000*a* or 1000*b*. In some implementations, the controller 950 switches between employing the data provided by one or the other of the adaptive filters 920 and 940 depending (at least in part) on the whether the electronically provided audio is being acoustically output through the acoustic driver 190, or not. In other implementations, the controller 950 does such switching based (at least in part) on monitoring the signal levels of the signals output by one or both of the internal microphone 120 and the external microphone 130 for occurrences of one or both of these signals falling below the minimum level setting.

Each of the electrical architectures discussed in relation to FIGS. 3*a-f* may employ either analog or digital circuitry, or a combination of both. Where digital circuitry is at least partly employed, that digital circuitry may include a processing device (e.g., a digital signal processor) accessing and executing a machine-readable sequence of instructions that causes the processing device to receive, analyze, compare, alter and/or output one or more signals, as will be described. As will also be described, such a sequence of instructions may cause the processing device to make determinations of whether or not an earpiece 100 and/or the entirety of one of the personal acoustic devices 1000*a* and 1000*b* is correctly positioned in response to the results of analyzing signals.

The inner microphone 120 and the outer microphone 130 may each be any of a wide variety of types of microphone, including and not limited to, an electret microphone. Although not specifically shown or discussed, one or more amplifying components, possibly built into the inner microphone 120 and/or the outer microphone 130, may be employed to amplify or otherwise adjust the signals output by the inner microphone 120 and/or the outer microphone 130. It is preferred that the sound detection and signal output characteristics of the inner microphone 120 and the outer microphone 130 are substantially similar to avoid any need to compensate for substantial sound detection or signal output differences.

Where characteristics of signals provided by a microphone are analyzed in a manner entailing a comparison to stored data, the stored data may be derived through modeling of acoustic characteristics and/or through the taking of various measurements during various tests. Such tests may entail efforts to derive data corresponding to averaging measurements of the use of a personal acoustic device with a representative sampling of the shapes and sizes of people's ears and heads.

Other implementations are within the scope of the following claims and other claims to which the applicant may be entitled.

The invention claimed is:

1. A method comprising:

analyzing an inner signal output by an inner microphone disposed within a cavity of a casing of an earpiece of a personal acoustic device and an outer signal output by an outer microphone disposed on the personal acoustic device so as to be acoustically coupled to an environment external to the casing of the earpiece;

determining an operating state of the earpiece based on the analyzing of the inner and outer signals;

wherein:

analyzing the inner and outer signals comprises comparing a signal level of the inner signal within a selected range of frequencies to a signal level of the outer signal within the selected range of frequencies; and determining the operating state of the earpiece comprises determining that the earpiece is in the operating state of being positioned in the vicinity of an ear at least partly in response to detecting that the difference between the signal levels of the inner signal and the outer signal within the selected range of frequencies is within a maximum degree of difference specified by a difference threshold setting; and imposing a transfer function on the outer signal that modifies a sound represented by the outer signal in a manner substantially similar to the manner in which a sound propagating from the environment external to the casing to the cavity is modified at a time when the earpiece is in the operating state of being positioned in the vicinity of an ear.

2. The method of claim 1, wherein imposing a transfer function on the outer signal comprises selecting a transfer function based at least partly on the manner in which ANR provided by the personal acoustic device modifies a sound propagating from the environment external to the casing to the cavity.

3. A method comprising:

analyzing an inner signal output by an inner microphone disposed within a cavity of a casing of an earpiece of a personal acoustic device and an outer signal output by an outer microphone disposed on the personal acoustic device so as to be acoustically coupled to an environment external to the casing of the earpiece; and determining an operating state of the earpiece based on the analyzing of the inner and outer signals; and wherein analyzing the inner and outer signals comprises analyzing a difference between a first transfer function representing the manner in which a sound emanating from an acoustic noise source in the environment external to the casing changes as it propagates from the noise source to the inner microphone within the cavity and a second transfer function representing the manner in which the sound changes as it propagates from the noise source to the outer microphone by deriving a third transfer function that is at least indicative of the difference between the first and second transfer functions.

4. The method of claim 3, wherein determining the operating state of the earpiece comprises determining that the difference between the third transfer function and one of a first stored transfer function corresponding to the operating state of being positioned in the vicinity of an ear and a second stored transfer function corresponding to the operating state of not being positioned in the vicinity of an ear is within a maximum degree of difference specified by a difference threshold setting.

5. The method of claim 3, wherein determining the operating state of the earpiece comprises determining that at least one characteristic of the third transfer function is closer to a corresponding characteristic of one of a first stored transfer function corresponding to the operating state of being positioned in the vicinity of an ear and a second stored transfer function corresponding to the operating state of not being positioned in the vicinity of an ear than to the other.

6. The method of claim 3, further comprising:

acoustically outputting electronically provided audio into the cavity through an acoustic driver at least partly disposed within the cavity;

monitoring a signal level of the outer signal;

deriving a fourth transfer function representing the manner in which the electronically provided audio acoustically output by the acoustic driver changes as it propagates from the acoustic driver to the inner microphone; and determining the operating state of the earpiece based, at least in part, on analyzing a characteristic of the fourth transfer function.

7. The method of claim 6, wherein the determining of the operating state of the earpiece is based on either analyzing a difference between the inner signal and outer signal or analyzing a characteristic of the fourth transfer function, depending on at least one of whether the signal level of the outer signal at least meets a minimum level setting and whether electronically provided audio is currently being acoustically output into the cavity.

8. The method of claim 3, wherein analyzing a difference between the first and second transfer functions comprises:

employing an adaptive filter to filter one of the inner and outer signals, wherein the adaptive filter adapts filter coefficients according to an adaptation algorithm selected to reduce signal power of an error signal;

subtracting the one of the inner and outer signals from the other of the inner and outer signals to derive the error signal;

storing predetermined adaptive filter parameters representative of a known operating state of the personal acoustic device; and comparing adaptive filter parameters derived by the adaptive filter through the adaptation algorithm to the predetermined adaptive filter parameters.

9. The method of claim 8, wherein the adaptive filter parameters derived by the adaptive filter are the filter coefficients adapted by the adaptive filter.

10. The method of claim 8, wherein the adaptive filter parameters derived by the adaptive filter represent a frequency response of the adaptive filter corresponding to the filter coefficients adapted by the adaptive filter.

11. A personal acoustic device comprising:

a first earpiece having a first casing;

a first inner microphone disposed within a first cavity of the first casing and outputting a first inner signal representative of sounds detected by the first inner microphone;

a first outer microphone disposed on the personal acoustic device so as to be acoustically coupled to an environment external to the first casing and outputting a first outer signal representative of sounds detected by the first outer microphone;

a control circuit coupled to the first inner microphone and to the first outer microphone to receive the first inner signal and the first outer signal, to analyze a difference between the first inner signal and the first outer signal, and to determine an operating state of the first earpiece based, at least in part, on analyzing the difference between the first inner signal and the first outer signal; and wherein the first outer microphone is a communications microphone disposed on the personal acoustic device so as to detect speech sounds of the user.

12. A personal acoustic device comprising:

a first earpiece having a first casing;

a first inner microphone disposed within a first cavity of the first casing and outputting a first inner signal representative of sounds detected by the first inner microphone;

a first outer microphone disposed on the personal acoustic device so as to be acoustically coupled to an environment external to the first casing and outputting a first outer signal representative of sounds detected by the first outer microphone;

a control circuit coupled to the first inner microphone and to the first outer microphone to receive the first inner signal and the first outer signal, to analyze a difference between the first inner signal and the first outer signal, and to determine an operating state of the first earpiece based, at least in part, on analyzing the difference between the first inner signal and the first outer signal; and an audio controller coupled to the control circuit, wherein the control circuit, in response to determining that a change in operating state of at least the first earpiece has occurred, operates the audio controller to take an action selected from the group of actions consisting of muting audio detected by a communications microphone of the personal acoustic device, and rerouting audio to be acoustically output by a first acoustic driver of the first earpiece to being acoustically output by a second acoustic driver of a second earpiece of the personal acoustic device.

13. A personal acoustic device comprising:

a first earpiece having a first casing;

a first inner microphone disposed within a first cavity of the first casing and outputting a first inner signal representative of sounds detected by the first inner microphone;

a first outer microphone disposed on the personal acoustic device so as to be acoustically coupled to an environment external to the first casing and outputting a first outer signal representative of sounds detected by the first outer microphone;

a control circuit coupled to the first inner microphone and to the first outer microphone to receive the first inner signal and the first outer signal, to analyze a difference between the first inner signal and the first outer signal, and to determine an operating state of the first earpiece based, at least in part, on analyzing the difference between the first inner signal and the first outer signal; and wherein the control circuit comprises:

an adaptive filter to filter one of the first inner signal and the first outer signal, wherein the adaptive filter adapts filter coefficients according to an adaptation algorithm selected to reduce signal power of an error signal;

a differential summer to subtract the one of the first inner signal and the first out signal from the other of the first inner signal and the first outer signal to derive the error signal;

a storage in which is stored predetermined adaptive filter parameters representative of a known operating state of the personal acoustic device; and a controller for comparing adaptive filter parameters derived by the adaptive filter through the adaptation algorithm to the predetermined adaptive filter parameters stored in the storage.

14. The personal acoustic device of claim 13, wherein the adaptive filter parameters derived by the adaptive filter are the filter coefficients adapted by the adaptive filter.

* * * * *